US012666818B2

(12) United States Patent
Cho et al.

(10) Patent No.: US 12,666,818 B2
(45) Date of Patent: Jun. 23, 2026

(54) BLOCKING LINE OVERLAPPING CONDUCTIVE LINE CONTACT AREA AND DISPLAY DEVICE HAVING THE SAME

(71) Applicant: Samsung Display Co., LTD., Yongin-si (KR)

(72) Inventors: Seung-Hwan Cho, Yongin-si (KR); Wonsuk Choi, Seoul (KR); Yoonsun Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 706 days.

(21) Appl. No.: 17/992,502

(22) Filed: Nov. 22, 2022

(65) Prior Publication Data

US 2023/0232677 A1 Jul. 20, 2023

(30) Foreign Application Priority Data

Jan. 14, 2022 (KR) ........................ 10-2022-0005832

(51) Int. Cl.
H10K 59/131 (2023.01)
H10K 59/122 (2023.01)

(52) U.S. Cl.
CPC ......... H10K 59/131 (2023.02); H10K 59/122 (2023.02)

(58) Field of Classification Search
CPC .. H10K 59/131; H10K 59/122; H10K 59/123; H10K 77/111; H10K 2102/311; H10D 86/411; H10D 86/443; H10D 86/60; H10D 86/441; H10H 29/142; H10H 20/857; G02F 1/136286; G02F 1/133305
See application file for complete search history.

(56) References Cited

U.S. PATENT DOCUMENTS

| | | | |
|---|---|---|---|
| 2017/0358641 A1* | 12/2017 | Park | ................... H10K 59/1213 |
| 2020/0089368 A1 | 3/2020 | Shim et al. | |
| 2022/0310752 A1* | 9/2022 | Liu | ...................... H10K 59/131 |

FOREIGN PATENT DOCUMENTS

| CN | 113725232 A | * 11/2021 | .......... H10K 50/844 |
|---|---|---|---|
| KR | 20200032780 A | 3/2020 | |
| KR | 1020220144451 A | 10/2022 | |

* cited by examiner

*Primary Examiner* — Brian Turner
*Assistant Examiner* — Zhijun Xu
(74) *Attorney, Agent, or Firm* — CANTOR COLBURN LLP

(57) ABSTRACT

A display device includes a display area, a bending area, and a contact area between the display area and the bending area, a first gate connection line, in the contact area and extended toward the display area, a first source connection line on the first gate connection line and electrically connected to the first gate connection line, in the contact area, a second source connection line on the first source connection line and electrically connected to the first source connection line, in the contact area, and a blocking line on the second source connection line and electrically connected to the second source connection line, in the contact area.

19 Claims, 36 Drawing Sheets

F I G.  1B

CL

VSL2

VDL

CL

CR1
BR
CR2

VSL1

RA

FIG. 2
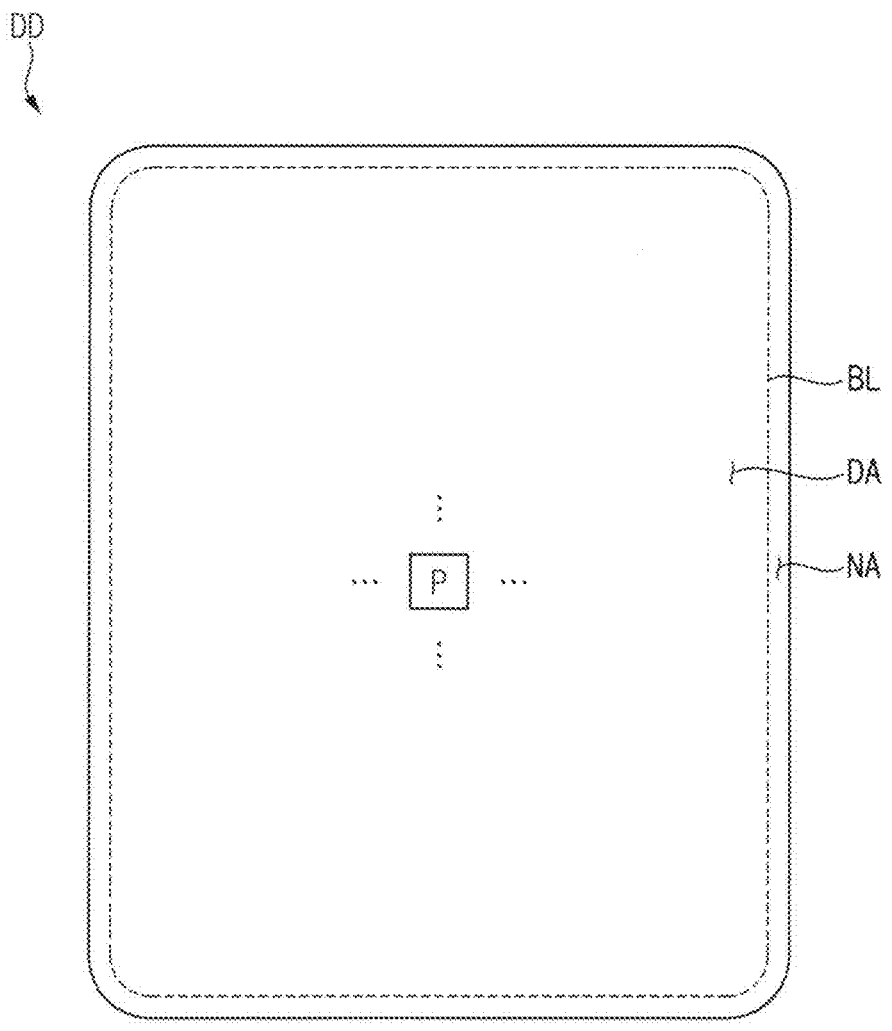
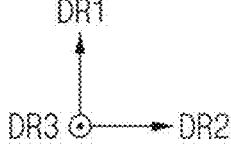

FIG. 3A
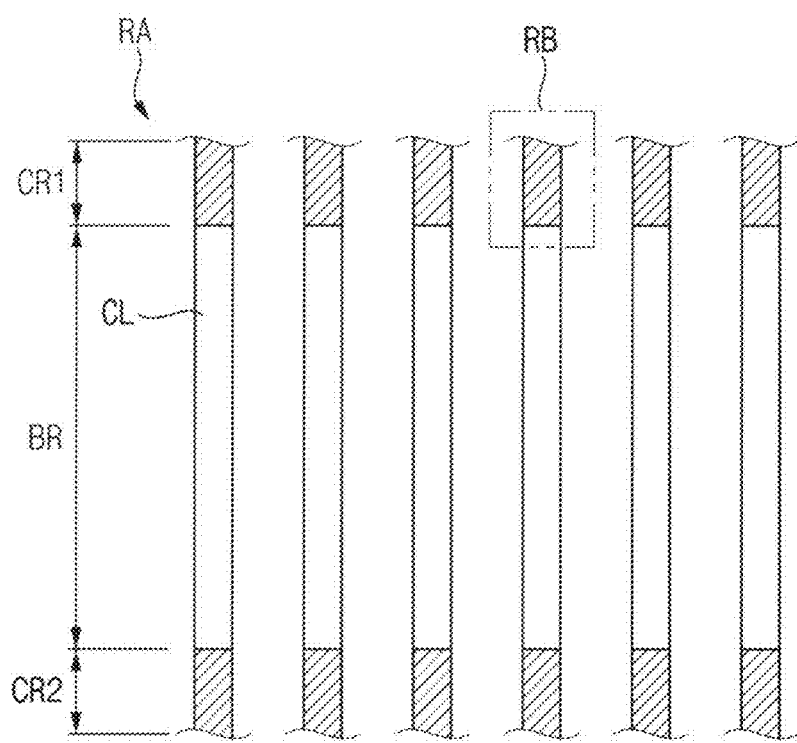
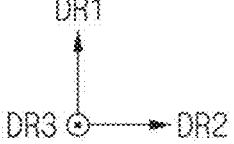

ILD2
ILD1
GCE1
GI
BUF
SUB

VCE

SCE1

GCE2

SPC
PDL
VIA3
VIA2
SCE2
VIA1

RRE

ENC

PDL

VIA3

VIA2

VIA1

ILD2
ILD1
GI
BUF
SUB

ED { ANO ML CATH }

CE2

CE1

DE

SE

ACT GE CPE   TFT

DA

BLOCKING LINE OVERLAPPING CONDUCTIVE LINE CONTACT AREA AND DISPLAY DEVICE HAVING THE SAME

This application claims priority to Korean Patent Application No. 10-2022-0005832, filed on Jan. 14, 2022, and all the benefits accruing therefrom under 35 U.S.C. § 119, the content of which in its entirety is herein incorporated by reference.

BACKGROUND

(1) Field

Implementations of the invention relate generally to a display device displaying an image.

(2) Description of the Related Art

A display device is manufactured (or provided) and used in various ways. The display device may provide visual information to outside the display device (e.g., to a user) by emitting light. The display device may include a liquid crystal display device that emits lights using a liquid crystal layer, an inorganic light emitting display device that emits light using an inorganic light emitting diode, and an organic light emitting display device that emits light using an organic light emitting diode, etc.

The display device may include a display panel and electronic devices which are disposed on the display panel. The electronic devices may transmit signals (e.g., one or more electrical signal) to the display panel. In this case, the electronic devices may be connected to the display panel by conductive lines as signal lines.

SUMMARY

The display device and the electronic devices may be bendable at a portion thereof to be bent. Lifting may occur between the electronic devices and conductive lines due to pressure caused by bending. In this case, signals from the electronic devices may not be transmitted to the display panel, and an image may not be displayed on the display panel. Accordingly, in order to prevent decrease in image display, various research is being conducted Embodiments provide a display device including a bending area and which has reduced lifting (or separation) of elements from each other.

A display device according to an embodiment includes a substrate including a display area, a bending area, and a contact area between the display area and the bending area, a first gate connection line on the substrate in the contact area and extended toward the display area, a first source connection line on the first gate connection line and electrically connected to the first gate connection line, in the contact area, a second source connection line on the first source connection line and electrically connected to the first source connection line, in the contact area, and a blocking line on the second source connection line and electrically connected to the second source connection line, in the contact area.

According to an embodiment, the first gate connection line, the first source connection line, and the second source connection line may overlap each other in the contact area.

According to an embodiment, the display device may further include a first interlayer insulation layer between the first gate connection line and the first source connection line, first gate connection line and the first source connection line, a first via insulation layer between the first source connection line and the second source connection line, a second via insulation layer between the second source connection line and the blocking line, and a third via insulation layer on the second via insulation layer.

According to an embodiment, the second via insulation layer may include a plurality of grooves exposing the second source connection line, and the blocking line and the third via insulation layer may be disposed to fill the plurality of grooves.

According to an embodiment, the first via insulation layer may include a plurality of grooves exposing the first source connection line, and the second source connection line and the second via insulation layer may be disposed to fill the plurality of grooves.

According to an embodiment, the display device may further include a pixel defining layer on the third via insulation layer in the contact area, and a column spacer on the pixel defining layer in the contact area.

According to an embodiment, the first via insulation layer, the second via insulation layer, the third via insulation layer, the pixel defining layer, and the column spacer may extend from the contact area to the bending area.

According to an embodiment, the display device may further include a second gate connection line between the first gate connection line and the first source connection line. The second gate connection line may electrically connect the first gate connection line and the first source connection line.

According to an embodiment, the display device may further include a second gate connection line under the first gate connection line, and electrically connected to the first gate connection line.

A display device according to an embodiment may include a substrate including a display area, a bending area, and a contact area between the display area and the bending area, a first gate connection line on the substrate in the contact area and extending toward the display area, a first source connection line on the first gate connection line and electrically connected to the first gate connection line, in the contact area, a second source connection line on the first source connection line and electrically connected to the first source connection line, in the contact area, and a blocking line on the second source overlapping the second source connection line, in the contact area.

According to an embodiment, the first gate connection line, the first source connection line, the second source connection line, and the blocking line may overlap each other in the contact area.

According to an embodiment, the display device may further include a first interlayer insulation layer between the first gate connection line and the first source connection line, a first via insulation layer between the first source connection line and the second source connection line, a second via insulation layer between the second source connection line and the blocking line, and a third via insulation layer on the second via insulation layer.

According to an embodiment, the second via insulation layer may include a plurality of grooves exposing the second source connection line, and the blocking line and the third via insulation layer may be disposed to fill the plurality of grooves According to an embodiment, the first via insulation layer may include a plurality of grooves exposing the first source connection line, and the second source connection line and the second via insulation layer may be disposed to fill the plurality of grooves.

According to an embodiment, the display device may further include a pixel defining layer on the third via insulation layer in the contact area, and a column spacer on the pixel defining layer in the contact area.

According to an embodiment, the first via insulation layer, the second via insulation layer, the third via insulation layer, the pixel defining layer, and the column spacer may extend from the contact area to the bending area.

According to an embodiment, the display device may further include a voltage line on the same layer as the blocking line, may be spaced apart from the blocking line and closer to the display area than the blocking line According to an embodiment, a constant voltage may be applied to the blocking line which transmits the constant voltage.

According to an embodiment, the blocking line may extend toward the display area.

According to an embodiment, the display device may further include a second gate connection line between the first gate connection line and the first source connection line. The second gate connection line may electrically connect the first gate connection line and the first source connection line.

According to an embodiment, the display device may further include a second gate connection line under the first gate connection line, and electrically connected to the first gate connection line.

In the display device according to one or more embodiments, the blocking line may prevent impurities from penetrating into the second source connection line as one line of a plurality of underlying lines. The blocking line may be connected to the second source connection line. Accordingly, electrical resistance of the second source connection line may decrease. Through this, the second source connection line may not be overheated.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIG. 1A, FIG. 1B, and FIG. 2 are plan views illustrating a display device according to an embodiment.

FIG. 3A, FIG. 3B, FIG. 3C, FIG. 3D, FIG. 3E, FIG. 3F, FIG. 3G, FIG. 3H, FIG. 3I, and FIG. 3J are diagrams of an enlarged area of the display device of FIG. 1A.

FIG. 4A and FIG. 4B are cross-sectional views illustrating an area of FIG. 3A according to an embodiment.

FIG. 7A and FIG. 7B are cross-sectional views illustrating an area of FIG. 3A according to an embodiment.

FIG. 8A and FIG. 8B are cross-sectional views illustrating an area of FIG. 3A according to an embodiment.

FIG. 9A and FIG. 9B are cross-sectional views illustrating an area of FIG. 3A according to an embodiment.

FIG. 10A and FIG. 10B are cross-sectional views illustrating an area of FIG. 3A according to an embodiment.

FIG. 11A and FIG. 11B are cross-sectional views illustrating an area of FIG. 3A according to an embodiment.

FIG. 12A and FIG. 12B are cross-sectional views illustrating an area of FIG. 3A according to an embodiment.

FIG. 13A and FIG. 13B are cross-sectional views illustrating an area of FIG. 3A according to an embodiment.

FIG. 14A and FIG. 14B are cross-sectional views illustrating an area of FIG. 3A according to an embodiment.

FIG. 16 is a cross-sectional view taken along line I-I' of FIG. 15.

FIG. 17 is a cross-sectional view illustrating a pixel included in the display device of FIG. 1A.

DETAILED DESCRIPTION

Figure 1A:
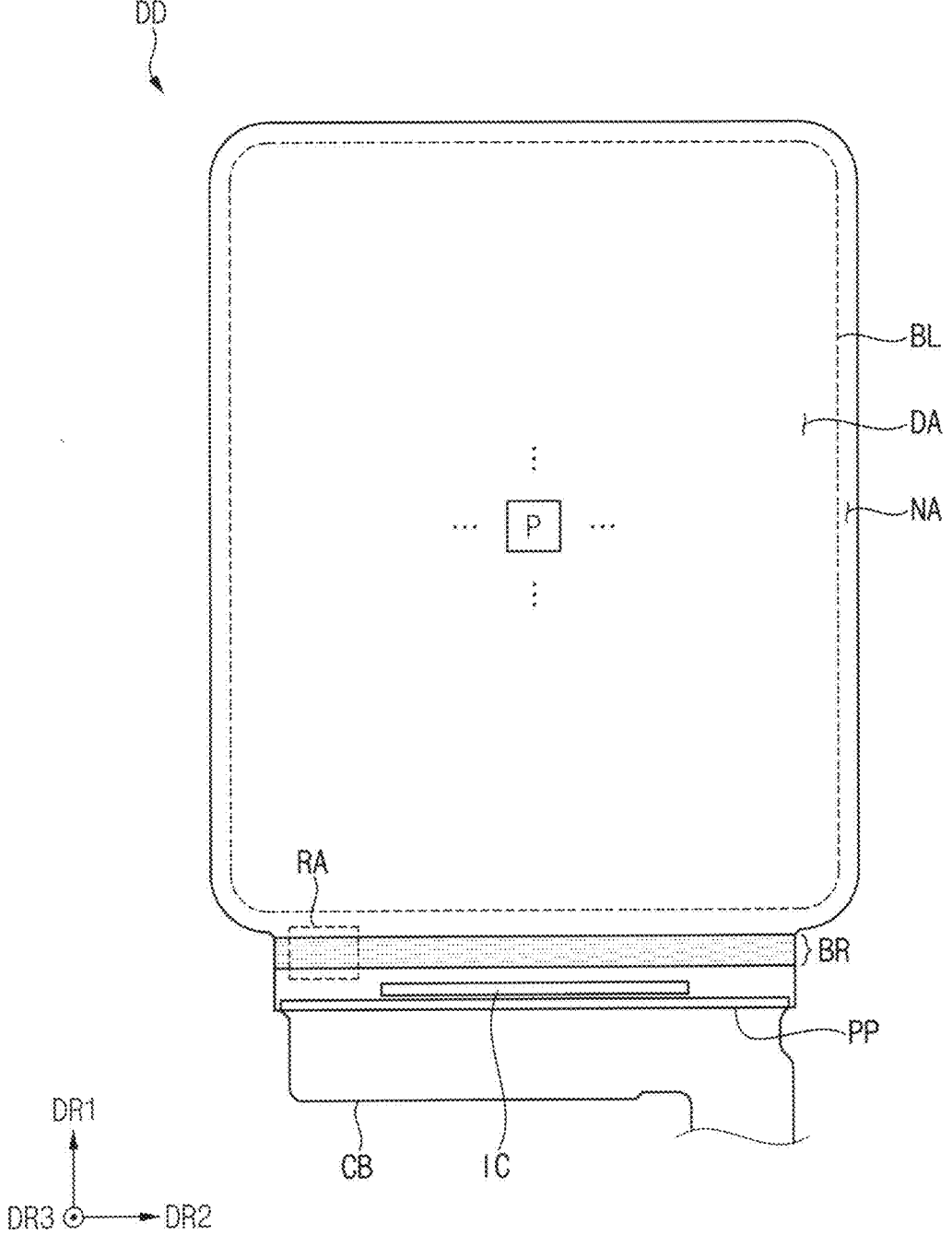

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Like reference numerals refer to like elements throughout. As used herein, a reference number may indicate a singular element or a plurality of the element. For example, a reference number labeling a singular form of an element within the drawing figures may be used to reference a plurality of the singular element within the text of specification."

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 1B:
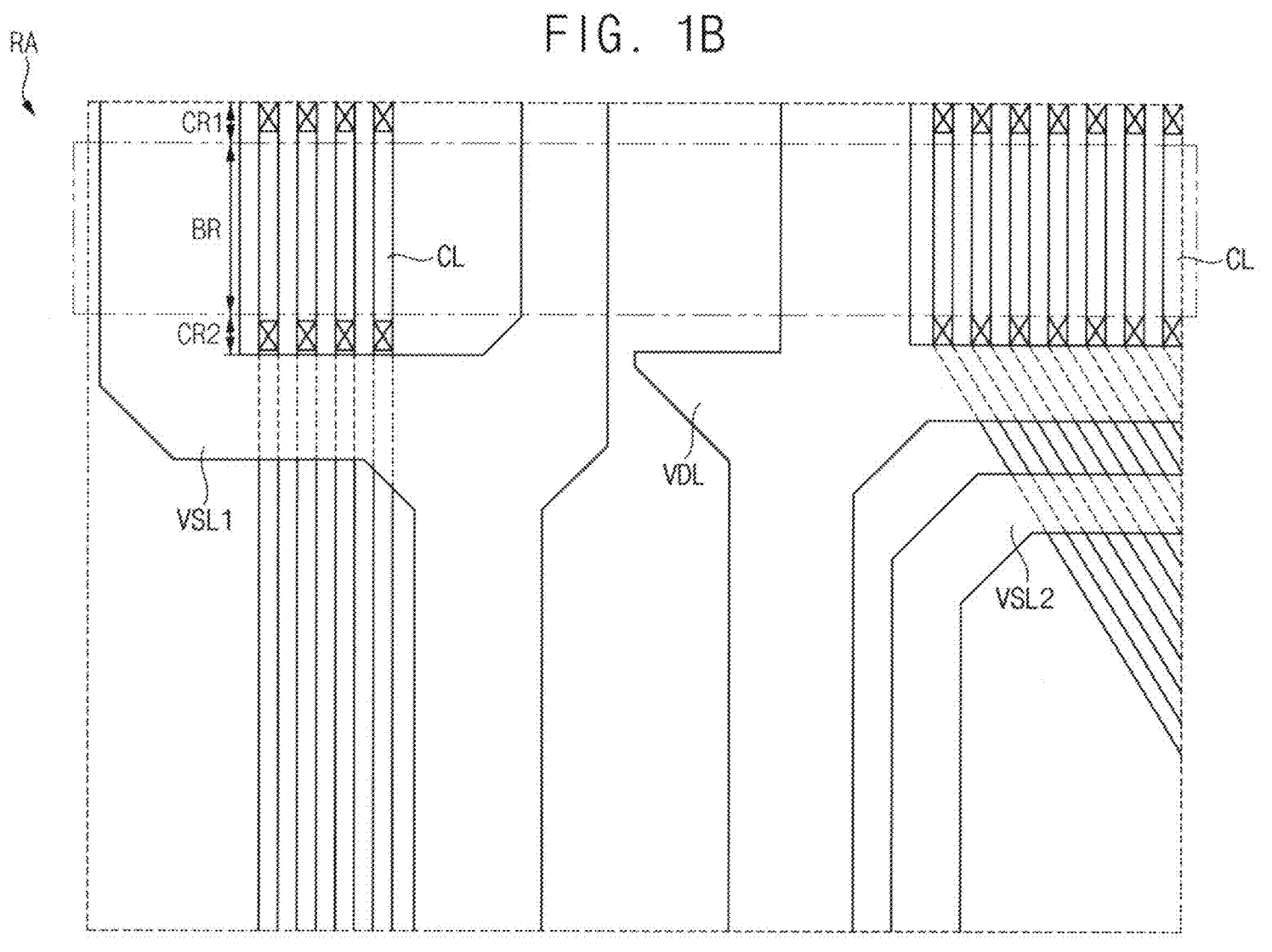

FIG. 1A, FIG. 1B, and FIG. 2 are plan views illustrating a display device DD according to an embodiment.

Referring to FIG. 1A, a display device DD may include a display area DA and a non-display area NA. The non-display area NA is adjacent to the display are DA and may be disposed around the display area DA. Devices (e.g., electronic devices) and/or lines CL (e.g., signal lines, conductive lines, etc.) for generating and/or transmitting various signals (e.g., one or more electrical signals) applied to the display area DA may be disposed (or provided) in the non-display area NA. In FIG. 1A, a boundary BL may be defined between the display area DA and the non-display area NA. A space (or area) inside of the boundary BL may be defined as the display area DA, and a space (or area) outside of the boundary BL may be defined as the non-display area NA.

A pixel P provided in plural including a plurality of pixels P may be disposed in the display area DA. The plurality of pixels P may be arranged in various shapes in the display area DA. For example, the plurality of pixels P may be arranged in a matrix form in the display area DA. A plurality of conductive lines connected to the plurality of pixels P may be disposed in the display area DA. The plurality of conductive lines may transmit an electrical signal such as a gate signal, a data signal, a power voltage, an initialization voltage, etc. to the plurality of pixels P. Some of the plurality of conductive lines may extend in a first direction DR1, and others of the plurality of conductive lines may be extend in a second direction DR2 crossing the first direction DR1.

The display device DD and various components or layers thereof may be disposed in a plane defined by the first direction DR1 and the second direction DR2 which cross each other. A thickness direction of the display device DD and various components or layers thereof may be defined along a third direction DR3 crossing each of the first direction DR1 and the second direction DR2.

A plurality of driving parts for generating and/or processing signals for driving the plurality of pixels P may be disposed in the non-display area NA. The plurality of driving parts may include a data driving part, a gate driving part, a controller controlling the data driving part and the gate driving part, a power voltage generator, etc.

The gate driving part may be integrated as a driving circuit in the non-display area NA. The driving circuit may be disposed to extend in the first direction DR1 at each of opposing sides of the display area DA along the second direction DR2. The driving circuit may include a shift resistor including a plurality of stages subordinately connected to each other. Each of the plurality of stages may generate the gate signal and may transmit the gate signal to the plurality of pixels P.

An integrated circuit chip IC may be integrated in the non-display area NA. In an embodiment, the integrated circuit chip IC may be integrated in a circuit board CB. The integrated circuit chip IC may transmit data voltage, etc. to the plurality of pixels P.

A pad part PP may be disposed in the non-display area NA. A plurality of pads, which are connection terminals for receiving signals from outside (e.g., outside the display device DD), may be disposed in the pad part PP. The pad part PP may extend in the second direction DR2. The circuit board CB may be connected to the pad part PP.

FIG. 1B is a diagram enlarging a first area RA of the non-display area NA. Referring to FIG. 1B, a first low power voltage line VSL1, a second low power voltage line VSL2, a high power voltage line VDL, and a plurality of lines CL may be disposed in the non-display area NA.

Low power voltage may be applied to (or transmitted by) the first low power voltage line VSL1 and a second low power voltage line VSL2, and high power voltage having a higher voltage level than the low power voltage may be applied to (or transmitted by) the high power voltage line VDL. The low power voltage and the high power voltage may be applied to a cathode electrode CATH and an anode electrode ANO of a light emitting element ED.

The first low power voltage line VSL1, the second low power voltage line VSL2, and the high power voltage line VDL may not overlap each other. That is, elements as not overlapping each other, may be adjacent to each other, spaced apart from each other, etc. in a plan view. A portion of each of the first low power voltage line VSL1, the second low power voltage line VSL2, and the high power voltage line VDL may overlap a bending area BR of the display device DD. Various components or layers of the display device DD may include a display area DA, a non-display area NA, a bending area BR, etc. corresponding to those described above. The display device DD and various components thereof may be bendable at the bending area BR.

Along a thickness direction, the plurality of lines CL may be disposed under the first low power voltage line VSL1, the second low power voltage line VSL2, and the high power voltage line VDL. Clock signal, start signal, the data signal, the initialization signal, etc. as various electrical signals may be applied to (or transmitted by) the plurality of lines CL.

A portion of the plurality of lines CL may overlap the bending area BR. The plurality of lines CL may have a structure in which a plurality of conductive layers is connected to each other. The plurality of conductive layers may be connected to each other by (or at) a contact hole in an intervening layer or underlying layer. For example, in a first contact area CR1 and a second contact area CR2, different conductive layers may be connected to each other by a contact hole. This structure will be described with reference to figures to be described later.

A portion of the display device DD may be bendable, rollable, foldable, etc. to be bent, rolled, folded, etc. For example, a portion of the non-display area NA may be (or define) the bending area BR at which the display device DD is bendable. The bending area BR may be disposed between the display area DA and the pad part PP, in the non-display area NA. The bending area BR may be bent in a direction opposite to a third direction DR3 crossing each of the first direction DR1 and the second direction DR2 (e.g., a thickness direction). As shown in FIG. 2, when the bending area BR is bent, the integrated circuit chip IC and the circuit board CB may not be visible in the third direction DR3, or from outside the display device DD. When the bending area BR is bent, the bending area BR may have a predetermined curvature. That is, the display device DD which is bent disposes the circuit chip IC and the circuit board CB FIG. 3A, FIG. 3B, FIG. 3C, FIG. 3D, FIG. 3E, FIG. 3F, FIG. 3G, FIG. 3H, FIG. 3I, and FIG. 3J are diagrams enlarging an area (e.g., a planar area) of the display device DD of FIG. 1A. FIG. 3A, FIG. 3B, FIG. 3C, FIG. 3D, FIG. 3E, FIG. 3F, FIG. 3G, FIG. 3H, FIG. 3I, and FIG. 3J are diagrams illustrating the first contact area CR1 and the second contact area CR2 of the plurality of lines CL.

Referring to FIG. 1A and FIG. 3A, the plurality of lines CL which transmit signals to the display area DA may be disposed in the first area RA. The signals transmitted by the plurality of lines CL may be varied. For example, the signals may include the clock signal, the start signal, the low power voltage, the high power voltage, the initialization voltage, etc.

The first area RA may be adjacent to the display area DA along the first direction DR1. The plurality of lines CL may extend in the first direction DR1. The plurality of lines CL may extend along each of the first contact area CR1, the bending area BR, and the second contact area CR2 within the non-display area NA.

The first contact area CR1 may be closer to the display area DA than the bending area BR, and the second contact area CR2 may be closer to the pad part PP than the bending area BR. That is, the first contact area CR1, the bending area BR, and the second contact area CR2 may be in order in a direction away from the display area DA. A structure of the first contact area CR1 may be substantially the same as a structure of the second contact area CR2. The structure of the first contact area CR1 and the structure of the second contact area CR2 will be described later.

Figure 3B:
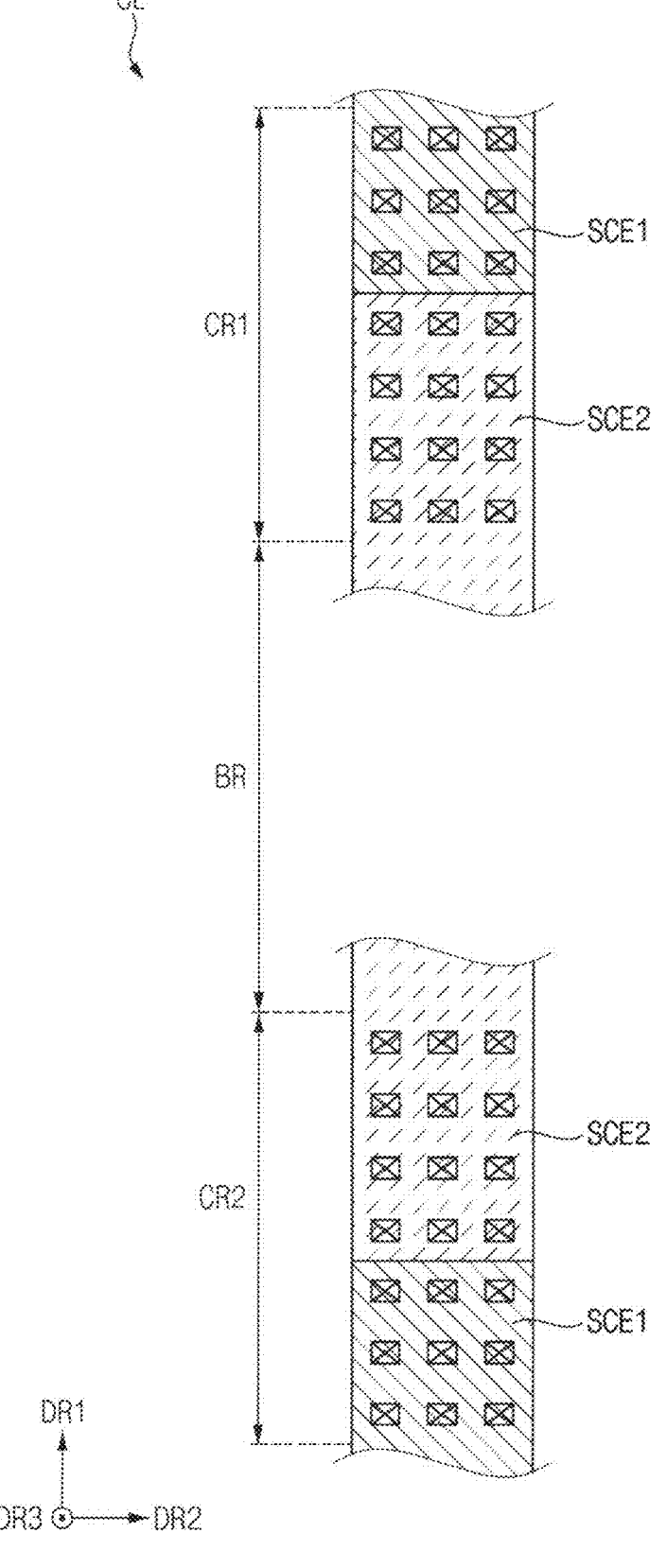

Referring to FIG. 1A and FIG. 3B, a first source connection line SCE1 and a second source connection line SCE2 which is disposed on the first source connection line SCE1 may be disposed in the first contact area CR1. The first source connection line SCE1 may be connected to a line disposed under the first source connection line SCE1 by a contact hole (box with "x" in FIGS. 1B and 3B, for example). The second source connection line SCE2 may overlap the first source connection line SCE1. The second source connection line SCE2 may be connected to the first source connection line SCE1 by contact hole. The contact hole may be provided in plural including a plurality of contact holes, without being limited thereto.

Figure 3C:
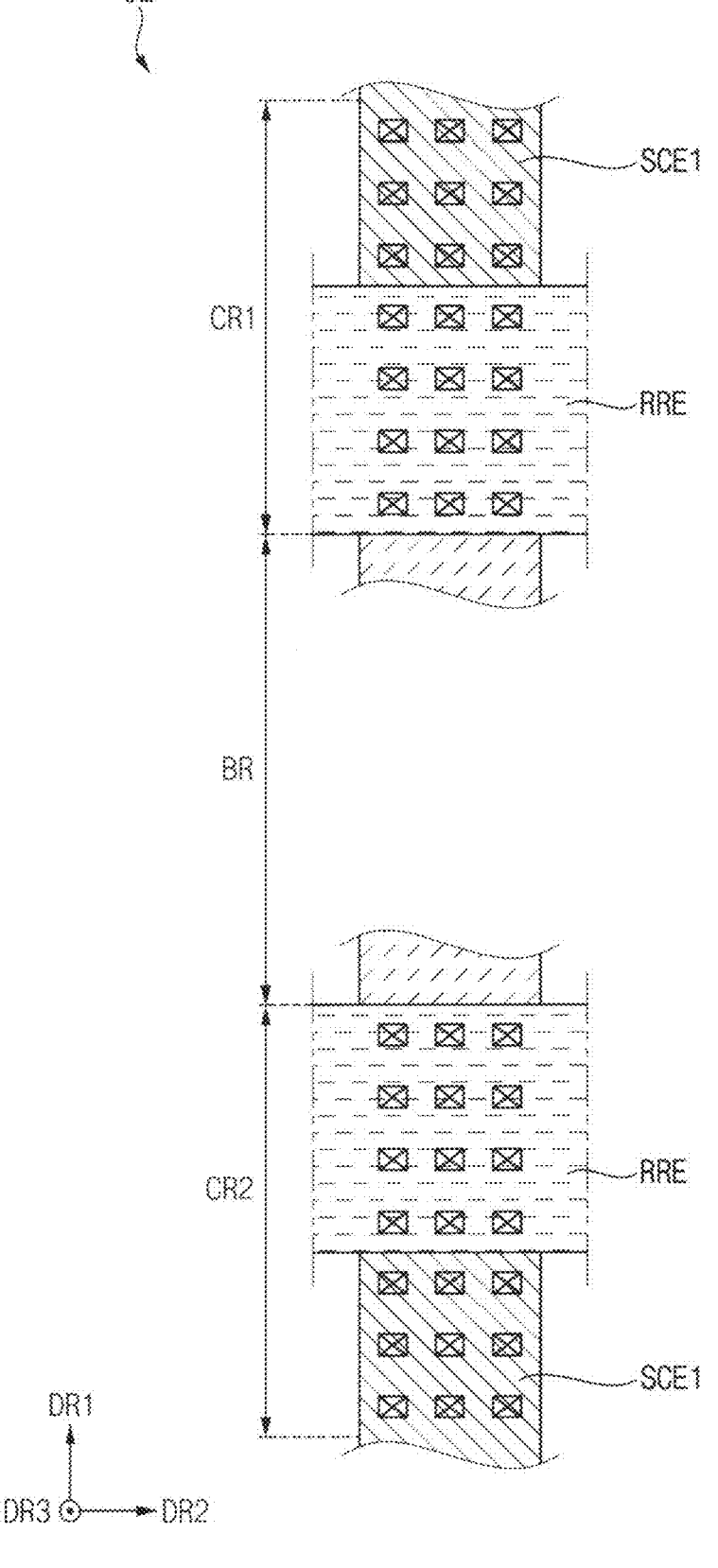
Figure 3D:
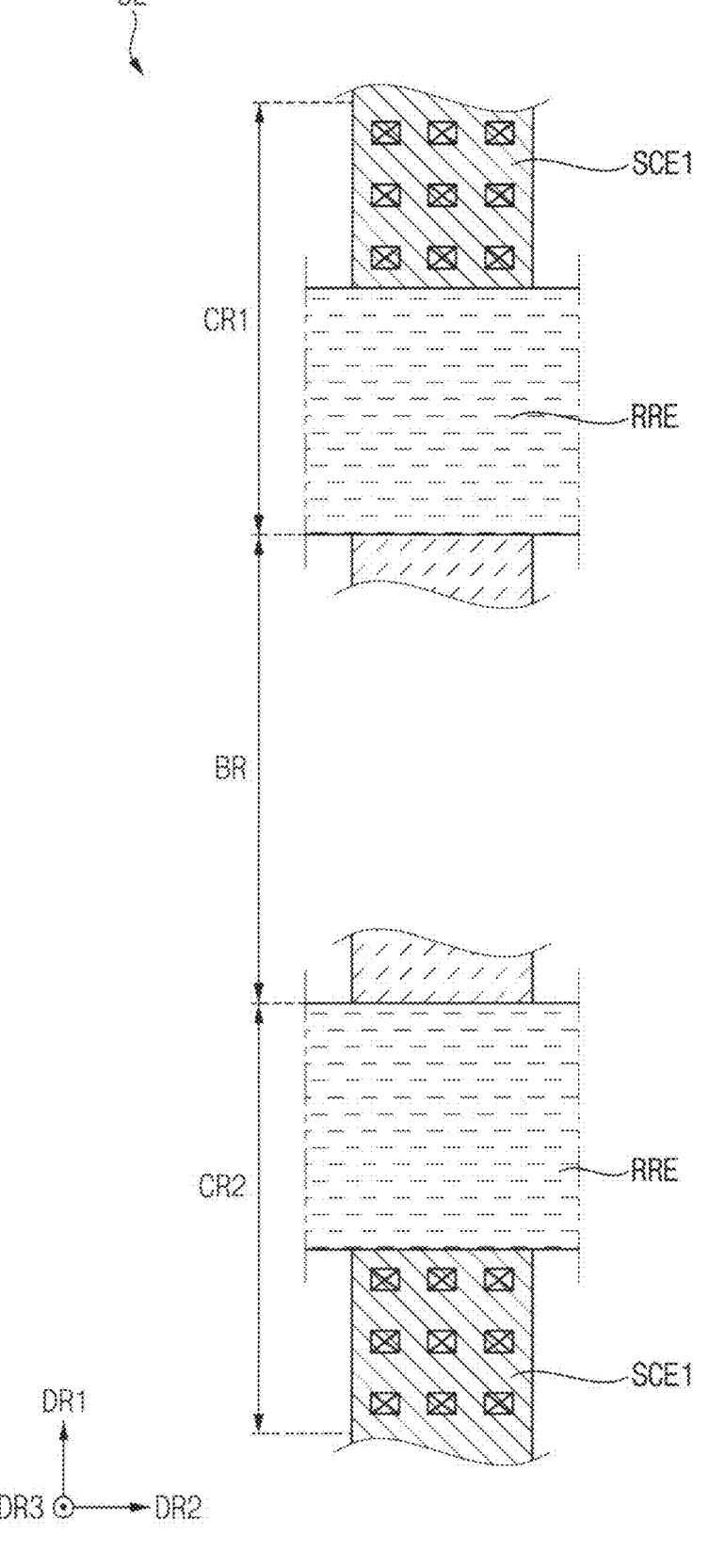

Referring to FIG. 3C and FIG. 3D, a blocking line RRE may be disposed on the second source connection line SCE2. As shown in FIG. 3C, the blocking line RRE may be connected to the second source connection line SCE2 by a contact hole. Alternatively, as shown in the FIG. 3D, the blocking line RRE may not be connected to the second source connection line SCE2 (e.g., no boxes with 'x' in FIG. 3D). In this case, the blocking line RRE may merely overlap the first source connection line SCE1.

Figure 3E:
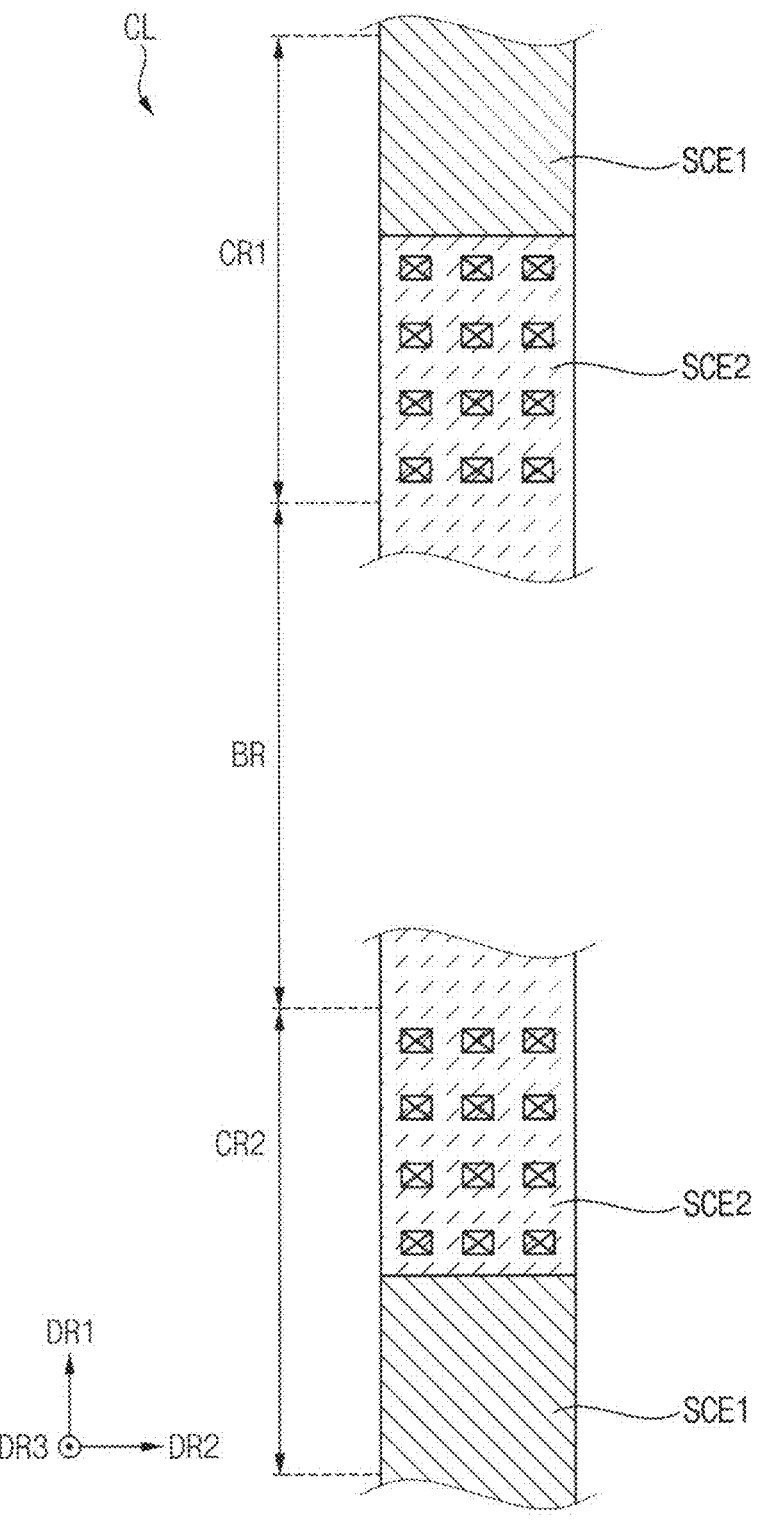

Referring to FIG. 1A and FIG. 3E, the first source connection line SCE1 may be connected to the second source connection line SCE2 by a contact hole. The first source connection line SCE1 may be connected to a line disposed under the first source connection line SCE1. An area where the first source connection line SCE1 is connected to the line by the contact hole and an area where the first source connection line SCE1 is connected to the second source connection line SCE2 may overlap in a plan view to define a contact area in a same planar area.

Figure 3F:
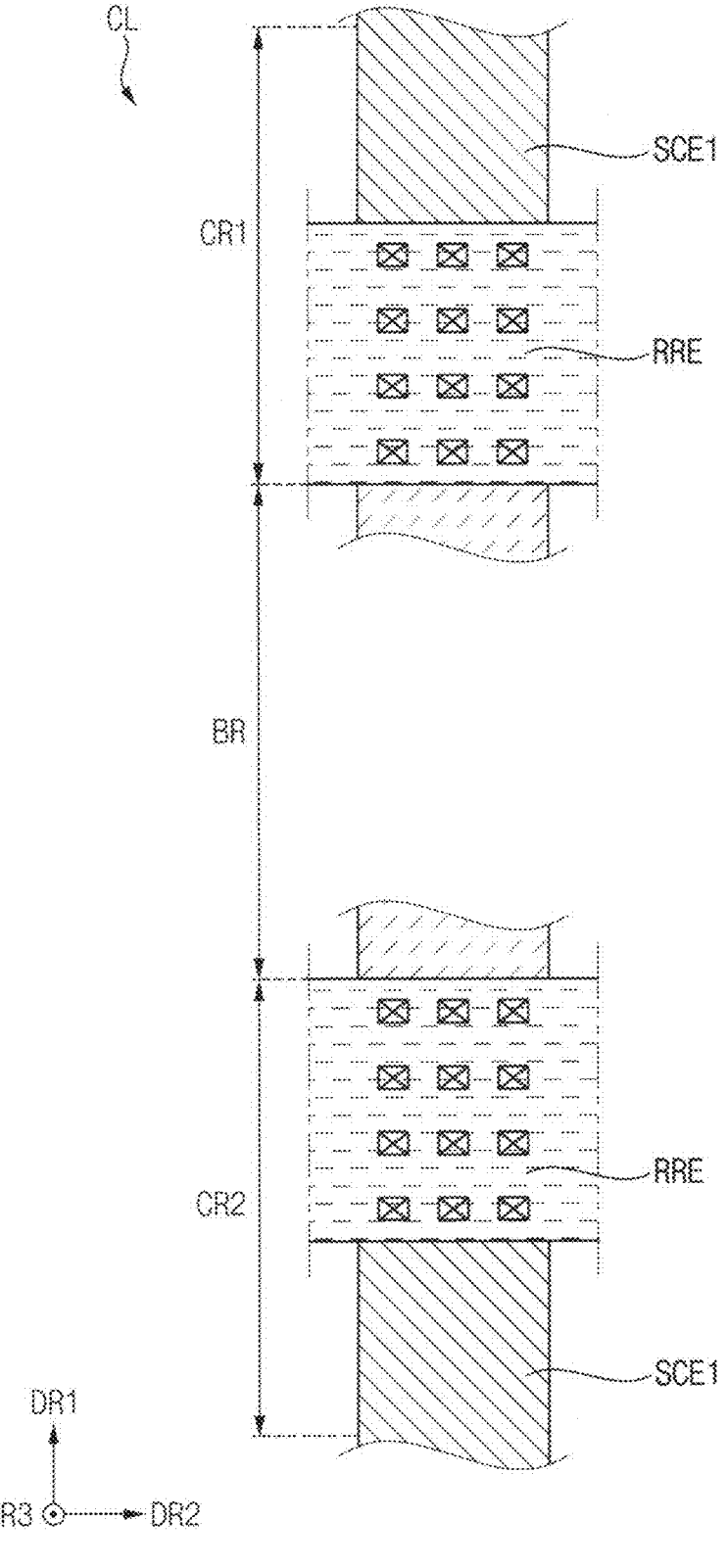
Figure 3G:
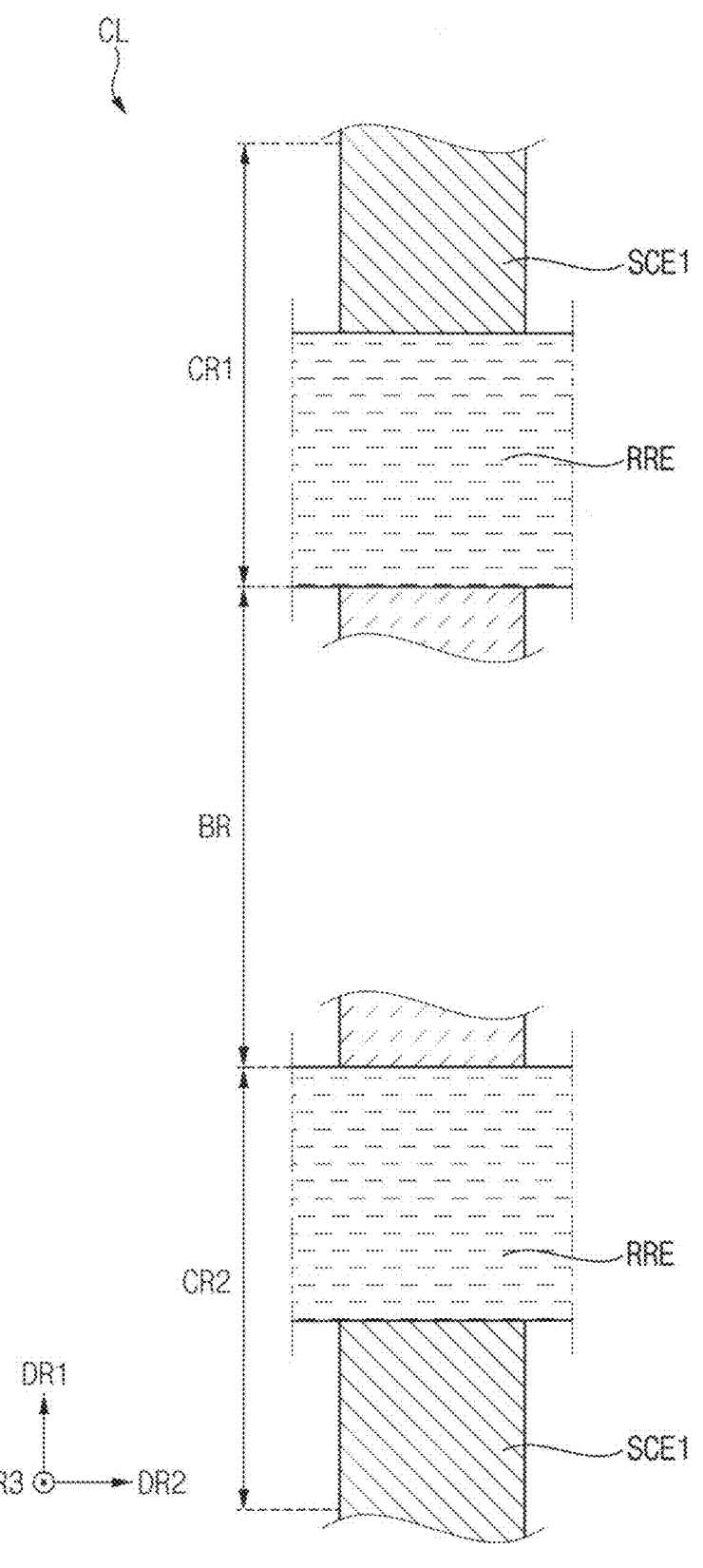

Referring to FIG. 3F and FIG. 3G, with reference to the same planar area of the contact area in FIG. 3E, the blocking line RRE may be disposed on the second source connection line SCE2. As shown in FIG. 3F, the blocking line RRE may be connected to the second source connection line SCE2 by a contact hole. Alternatively, as shown in FIG. 3G, the blocking line RRE may not be connected to the second source connection line SCE2. In this case, the blocking line RRE may merely overlap the first source connection line SCE1.

Figure 3H:
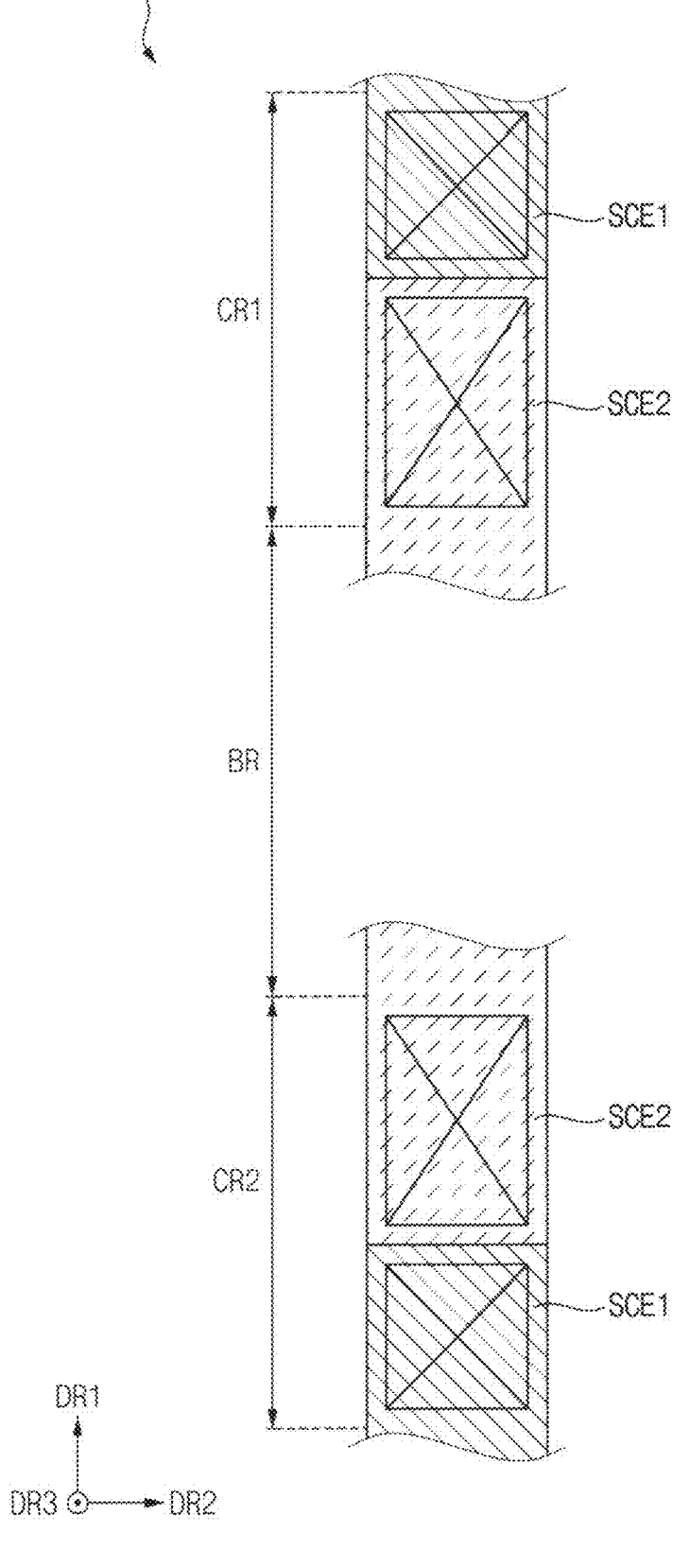
Figure 31:
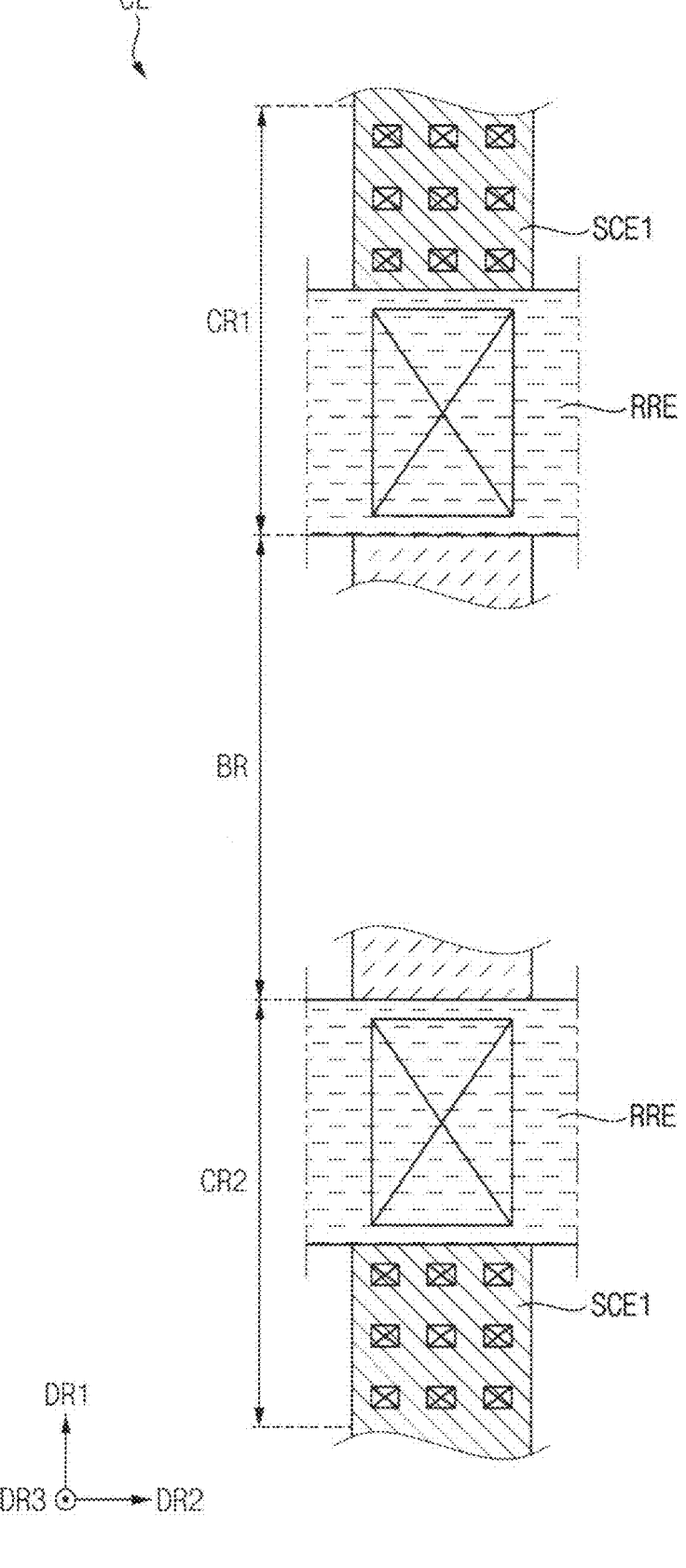
Figure 3J:
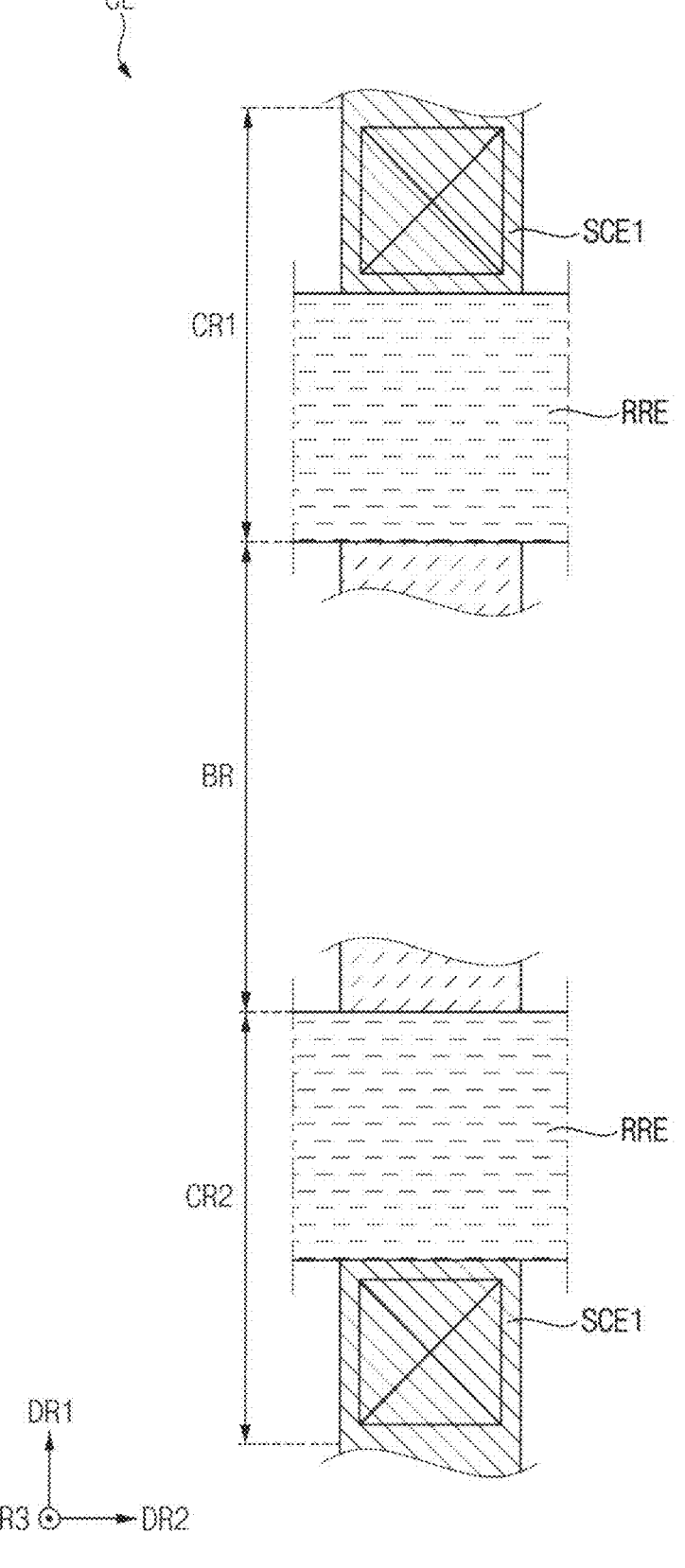

Referring to FIG. 3H, FIG. 3I and FIG. 3J, different conductive layers among the first source connection line SCE1, the second source connection line SCE2 and the blocking line RRE may be variously connected by one single contact hole instead of a plurality of contact holes. Alternatively, as shown in FIG. 3I, some conductive layers may be connected by one contact hole, and other conductive layers may be connected by a plurality of contact holes. As such, the number of contact holes may vary.

Figure 4A:
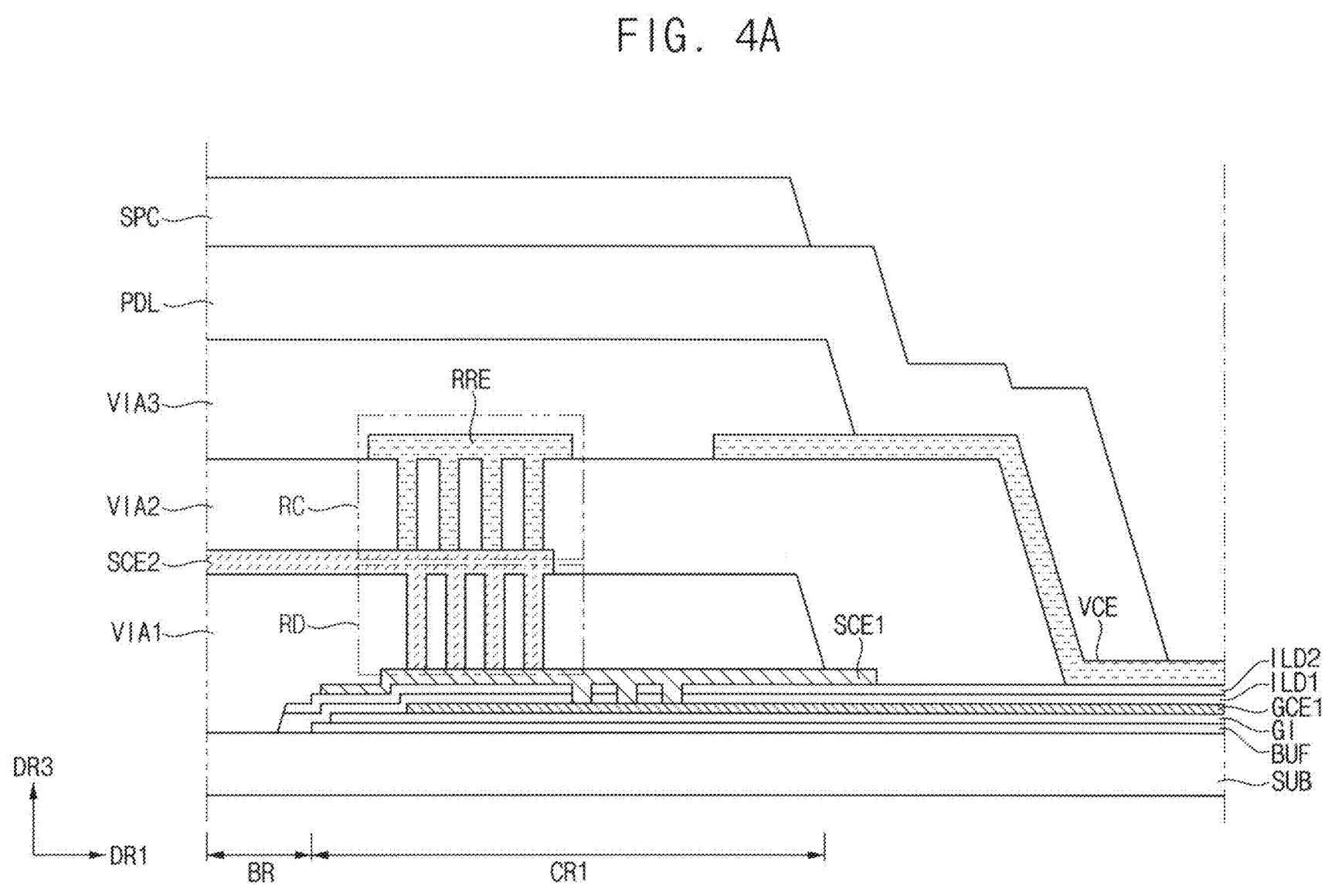
Figure 4B:
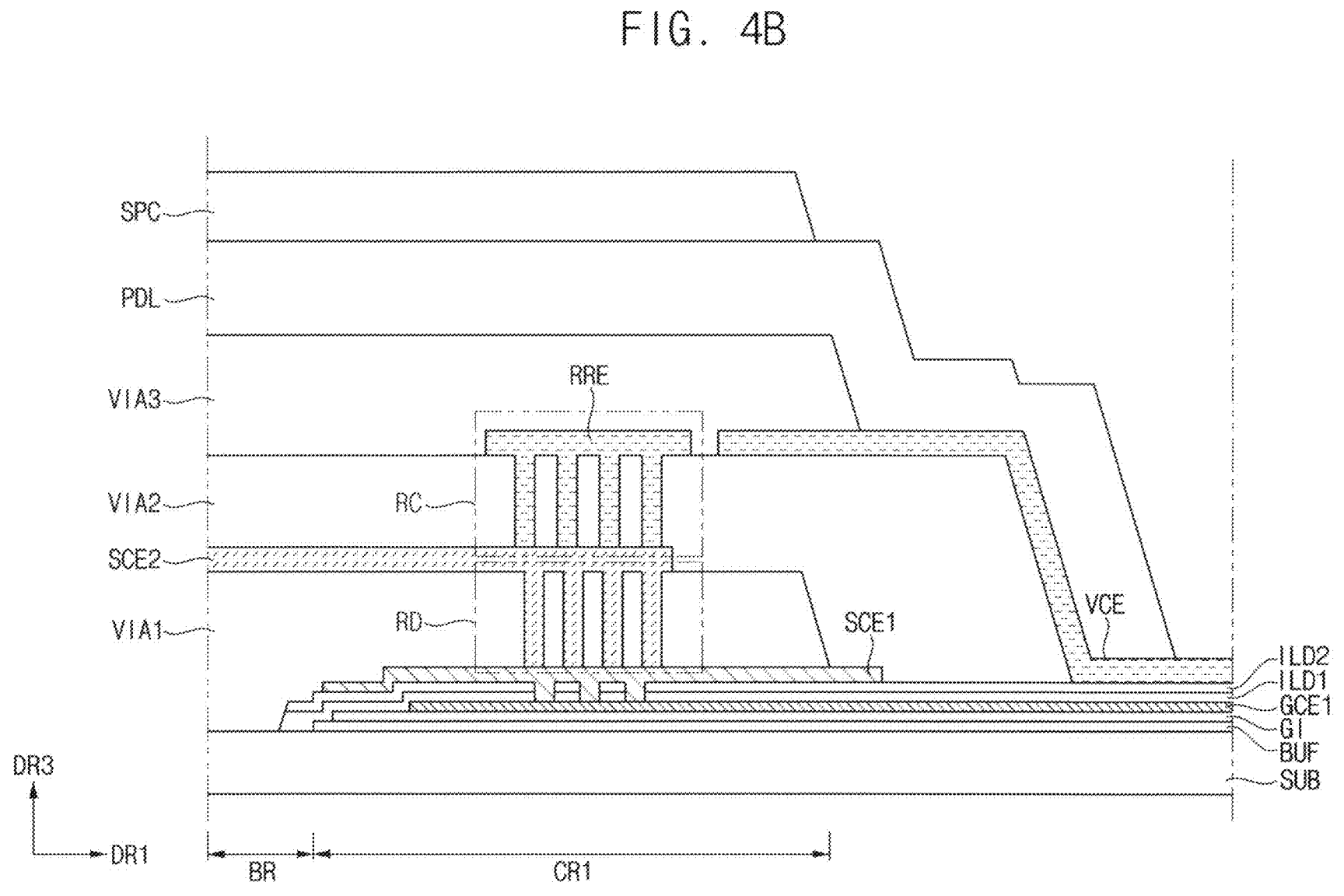

FIG. 4A and FIG. 4B are cross-sectional views illustrating an area of FIG. 3A according to an embodiment. FIG. 4A and FIG. 4B are cross-sectional views illustrating a second area RB of FIG. 3A.

Referring to FIG. 3B, FIG. 3C, and FIG. 4A, the display device DD may include a substrate SUB, a buffer layer BUF, a gate insulation layer GI, a first gate connection line GCE1, a first interlayer insulation layer ILD1, a second interlayer insulation layer ILD2, the first source connection line SCE1, a first via insulation layer VIA1, the second source connection line SCE2, a second via insulation layer VIA2, the blocking line RRE, a voltage line VCE, a third via insulation layer VIA3, a pixel defining layer PDL, and a column spacer SPC.

The substrate SUB may include a plastic and may have flexibility. Accordingly, the substrate SUB may be bendable to be bent in the bending area BR. Alternatively, the substrate SUB may include glass. In this case, the glass may have flexibility by patterning in the bending area BR.

The buffer layer BUF may be disposed on the substrate SUB. The buffer layer BUF may include an inorganic insulation material. An example of material included in the buffer layer BUF may be $SiO_x$, $SiN_x$, SiON, etc. These may be used alone or in combination with each other. The buffer layer BUF may prevent metal atoms or impurities from spreading upward (e.g., in the third direction DR3).

The gate insulation layer GI may be disposed on the buffer layer BUF. The gate insulation layer GI may include an inorganic insulation layer. An example of material included in the gate insulation layer GI may be $SiO_x$, $SiN_x$, SiON, etc. These may be used alone or in combination with each other.

The first gate connection line GCE1 may be disposed on the gate insulation layer GI. The first gate connection line GCE1 may extend in the first direction DR1 in the first contact area CR1. That is, the first gate connection line GCE1 may extend from the first contact area CR1 to the display area DA. In an embodiment, the first gate connection line GCE1 may be connected to a pixel P of the display area DA, without being limited thereto. The first gate connection line GCE1 may include metal, alloy, metal oxide, transparent conductive material, etc. An example of material included in the first gate connection line GCE1 may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The first interlayer insulation layer ILD1 may be disposed on the gate insulation layer GI to cover the first gate connection line GCE1. The first interlayer insulation layer ILD1 may include an inorganic insulation material. An example of material included in the first interlayer insulation layer ILD1 may be $SiO_x$, $SiN_x$, SiON, etc. These may be used alone or in combination with each other.

The second interlayer insulation layer ILD2 may be disposed on the first interlayer insulation layer ILD1. The second interlayer insulation layer ILD2 may include an inorganic insulation material. An example of material included in the second interlayer insulation layer ILD1 may be $SiO_x$, $SiN_x$, SiON, etc. These may be used alone or in combination with each other.

As shown in FIGS. 4A and 4B, the buffer layer BUF, the gate insulation layer GI, the first interlayer insulation layer ILD1, and the second interlayer insulation layer ILD2 may be partially disposed in the bending area BR. However, the invention is not limited thereto. Since the buffer layer BUF, the gate insulation layer GI, the first interlayer insulation layer ILD1, and the second interlayer insulation layer ILD2 includes an inorganic insulation material, ductility of the buffer layer BUF, the gate insulation layer GI, the first interlayer insulation layer ILD1, and the second interlayer insulation layer ILD2 may be low. Accordingly, the buffer layer BUF, the gate insulation layer GI, the first interlayer insulation layer ILD1, and the second interlayer insulation layer ILD2 may not be disposed in the bending area BR. That is, the buffer layer BUF, the gate insulation layer GI, the first interlayer insulation layer ILD1, and/or the second interlayer insulation layer ILD2 may be disconnected at the bending area BR such as to be omitted or excluded from the bending area BR.

The first source connection line SCE1 may be disposed on the second interlayer insulation layer ILD2. The first source connection line SCE1 may be disposed in the first contact area CR1. The first source connection line SCE1 may be connected to the first gate connection line GCE1 (as a "line") by a contact hole extended through an underlying layer. The first source connection line SCE1 may include metal, alloy, metal oxide, transparent conductive material, etc. An example of material included in the first source connection line SCE1 may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The first via insulation layer VIA1 may be disposed on the second interlayer insulation layer ILD2. The first via insulation layer VIA1 may cover a portion of the first source connection line SCE1. An upper surface of the first via insulation layer VIA1 may be substantially flat. In an embodiment, the first via insulation layer VIA1 may include an organic insulation material. An example of material included in the first via insulation layer VIA1 may be photoresist, polyacrylic resin, polyimide resin, acrylic resin, etc. These may be used alone or in combination with each other.

The second source connection line SCE2 may be disposed on the first via insulation layer VIA1. The second source connection line SCE2 may be extend from the bending area BR to be disposed in the first contact area CR1. The second source connection line SCE1 may be connected to the first source connection line SCE1 by a contact hole. The second source connection line SCE1 may include metal, alloy, metal oxide, transparent conductive material, etc. An example of material included in the second source connection line SCE2 may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

A plurality of lines CL may be connected to each other by a contact hole in the first contact area CR1. In this case, as the second source connection line SCE2 extends from the bending area BR to the first contact area CR1, signals transmitted from the pad part PP may be transmitted to the display area DA, through the first source connection line SCE1 and through the first gate connection line GCE1 in order.

The second via insulation layer VIA2 may be disposed on the first via insulation layer VIA1 to cover the first source connection line SCE1 and the second source connection line SCE2. An upper surface of the second via insulation layer VIA2 may be substantially flat. The second via insulation layer VIA2 may include an organic insulation material. An example of material included in the second via insulation layer VIA2 may be photoresist, polyacrylic resin, polyimide resin, acrylic resin, etc. These may be used alone or in combination with each other.

The blocking line RRE and the voltage line VCE may be disposed on the second via insulation layer VIA2. The voltage line VCE may extend from the first contact area CR1 and toward the display area DA. In this case, the voltage line VCE may be disposed on the second interlayer insulation layer ILD2. The blocking line RRE and the voltage line VCE may be simultaneously formed of (e.g., include) the same material. As being formed (or provided) in a same process and/or as including a same material, elements may be in a same layer as each other as respective portions of a same material layer, may be on a same layer by forming an interface with a same underlying or overlying layer, etc., without being limited thereto. The blocking line RRE may be disconnected from the voltage line VCE at the first contact area CR1.

The blocking line RRE may be electrically connected to the second source connection line SCE2 by a contact hole. The blocking line RRE may prevent impurities from penetrating into the second connection line SCE2 at a contact area of the second connection line SCE2. The blocking line RRE may be connected to the second source connection line SCE2 to reduce resistance (e.g., electrical) of the second source connection line SCE2. Through this, heat generation in the second source connection line SCE2 may be reduced or effectively prevented in the display device DD. The high power voltage or the low power voltage may flow through (e.g., be transmitted by) the voltage line VCE. The voltage line VCE may transmit a constant voltage, without being limited thereto.

The blocking line RRE and the voltage line VCE may include metal, alloy, metal oxide, transparent conductive material, etc. An example of material included in the blocking line RRE and the voltage line VCE may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The third via insulation layer VIA3 may be disposed on the second via insulation layer VIA2 to cover the blocking line RRE and the voltage line VCE. An upper surface of the third via insulation layer VIA3 may be substantially flat. The third via insulation layer VIA3 may include an organic insulation material. An example of material included in the third via insulation layer VIA3 may be photoresist, polyacrylic resin, polyimide resin, acrylic resin, etc. These may be used alone or in combination with each other.

The pixel defining layer PDL may cover the second via insulation layer VIA2, the third via insulation layer VIA3, and the voltage line VCE. The pixel defining layer PDL may include an organic insulation material. An example of material included in the pixel defining layer PDL may be photoresist, polyacrylic resin, polyimide resin, acrylic resin, etc. These may be used alone or in combination with each other.

The column spacer SPC may be disposed on the pixel defining layer PDL. The column spacer SPC may be disposed along edge of the non-display area NA to prevent a gap defect. Alternatively, the column spacer SPC may be disposed in a portion of the display area DA to prevent a gap defect of the display device DD. The column spacer SPC may include an organic insulation material. An example of material included in the column spacer SPC may be photoresist, polyacrylic resin, polyimide resin, acrylic resin, etc.

As described above, in the first contact area CR1, inorganic insulation layers BUF, GI, IL1, and ILD2, a plurality of lines GCE1, SCE1, SCE2, and RRE connected to each other by one or more contact holes, a plurality of organic insulation layers VIA1, VIA2, and VIA3, the pixel defining layer PDL, and the column spacer SPC may be disposed to overlap each other along a thickness direction. Accordingly, impurities penetrating from an upper part of the stacked structure may not penetrate into the plurality of lines GCE1, SCE1, SCE2, and RRE.

An area where the blocking line RRE is connected to the second source connection line SCE2 by a contact hole may overlap an area where the second source connection line SCE2 is connected to the first source connection line SCE1 by a contact hole.

As shown in FIG. 4A, an area where the first source connection line SCE1 is connected to the first gate connection line GCE1 by a contact hole may not overlap the area where the second source connection line SCE2 is connected to the first source connection line SCE1 by a contact hole. That is, contact areas may be spaced apart from each other along a length of the lines GCE1, SCE1, SCE2, and RRE, where a length is defined as a major dimension and a width is defined as a minor dimension in a plan view.

Alternatively, as shown in FIG. 3E, FIG. 3F, and FIG. 4B, an area where the first source connection line SCE1 is connected to the first gate connection line GCE1 by a contact hole may overlap the area where the second source connection line SCE2 is connected to the first source connection line SCE1 by a contact hole.

Figure 5:
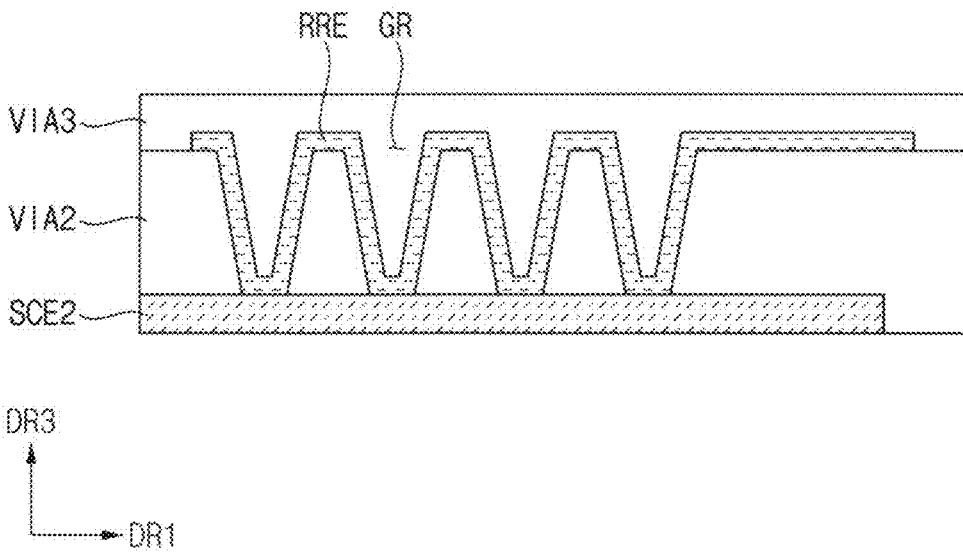
FIG. 5 is a diagram enlarging an area of FIG. 4A.

FIG. 5 is a diagram enlarging an area of FIG. 4A. FIG. 5 is a diagram enlarging a third area RC of FIG. 4A.

Referring to FIG. 4A and FIG. 5, the second via insulation layer VIA2 may include (or define) a plurality of grooves GR exposing the second source connection line SCE2 in the first contact area CR1 to outside the second via insulation layer VIA2. The blocking line RRE may extend along the second via insulation layer VIA2 and into the plurality of grooves GR to occupy a portion of the plurality of grooves GR, and may be electrically connected to the second source connection line SCE2 at the plurality of grooves GR. The third via insulation layer VIA3 may be disposed to fill a remainder of the plurality of grooves GR. That is, the blocking line RRE and the third via insulation layer VIA3 together fill the plurality of grooves GR which are defined by the second via insulation layer VIA2. Accordingly, an area in which the third via insulation layer VIA3 contacts the blocking line RRE (e.g., a contact area) may increase. In this case, separation of the third via insulation layer VIA3 by stress applied to the first contact area CR1 as the bending area BR is bent may be prevented.

Figure 6:
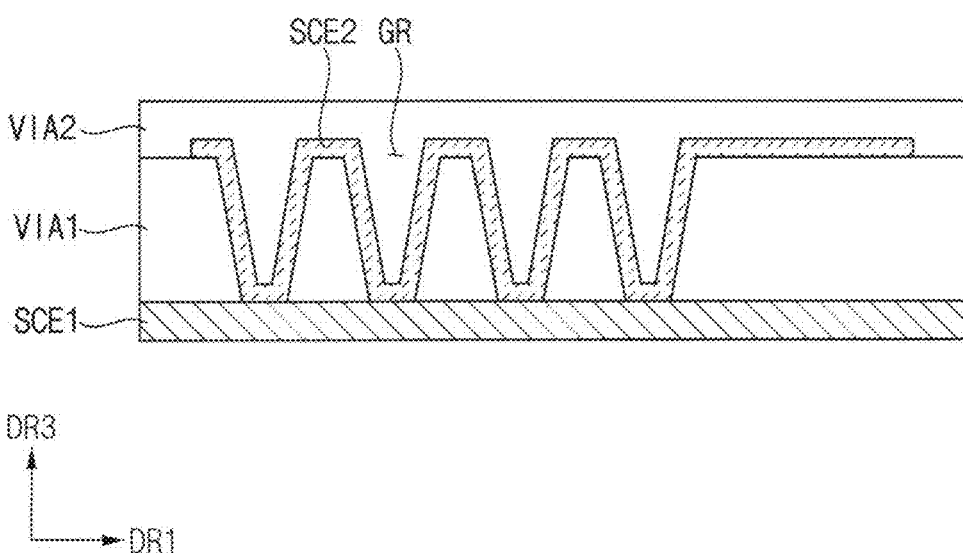
FIG. 6 is a diagram enlarging an area of FIG. 4A.

FIG. 6 is a diagram enlarging an area of FIG. 4A. FIG. 6 is a diagram enlarging a fourth area RD of FIG. 4A.

Referring to FIG. 4A and FIG. 6, the first via insulation layer VIA1 may include a plurality of grooves GR exposing the first source connection line SCE1 in the first contact area CR1 t outside the first via insulation layer VIA1. The second source connection line SCE2 may be disposed to occupy a portion of the plurality of grooves GR and may be electrically connected to the first source connection line SCE1 at the plurality of grooves GR. The second via insulation layer VIA2 may be disposed to fill a remainder of the plurality of grooves GR. That is, the second source connection line SCE2 and the second via insulation layer VIA2 together fill the plurality of grooves GR. Accordingly, an area in which the second via insulation layer VIA2 contacts the first source connection line SCE1 may increase. In this case, separation of the second via insulation layer VIA2 by stress applied to the first contact area CR1 as the bending area BR is bent may be prevented.

Figure 7A:
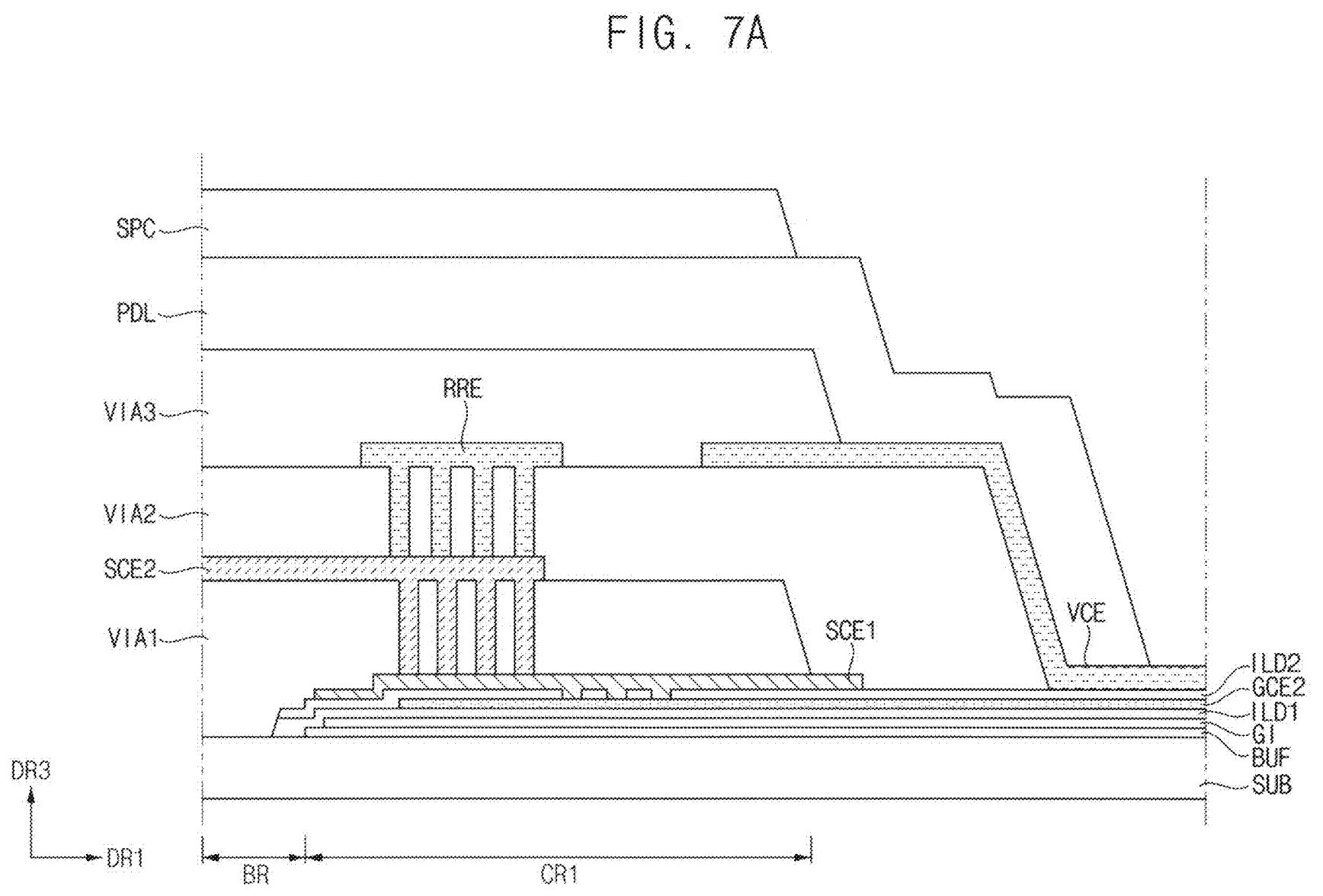
Figure 7B:
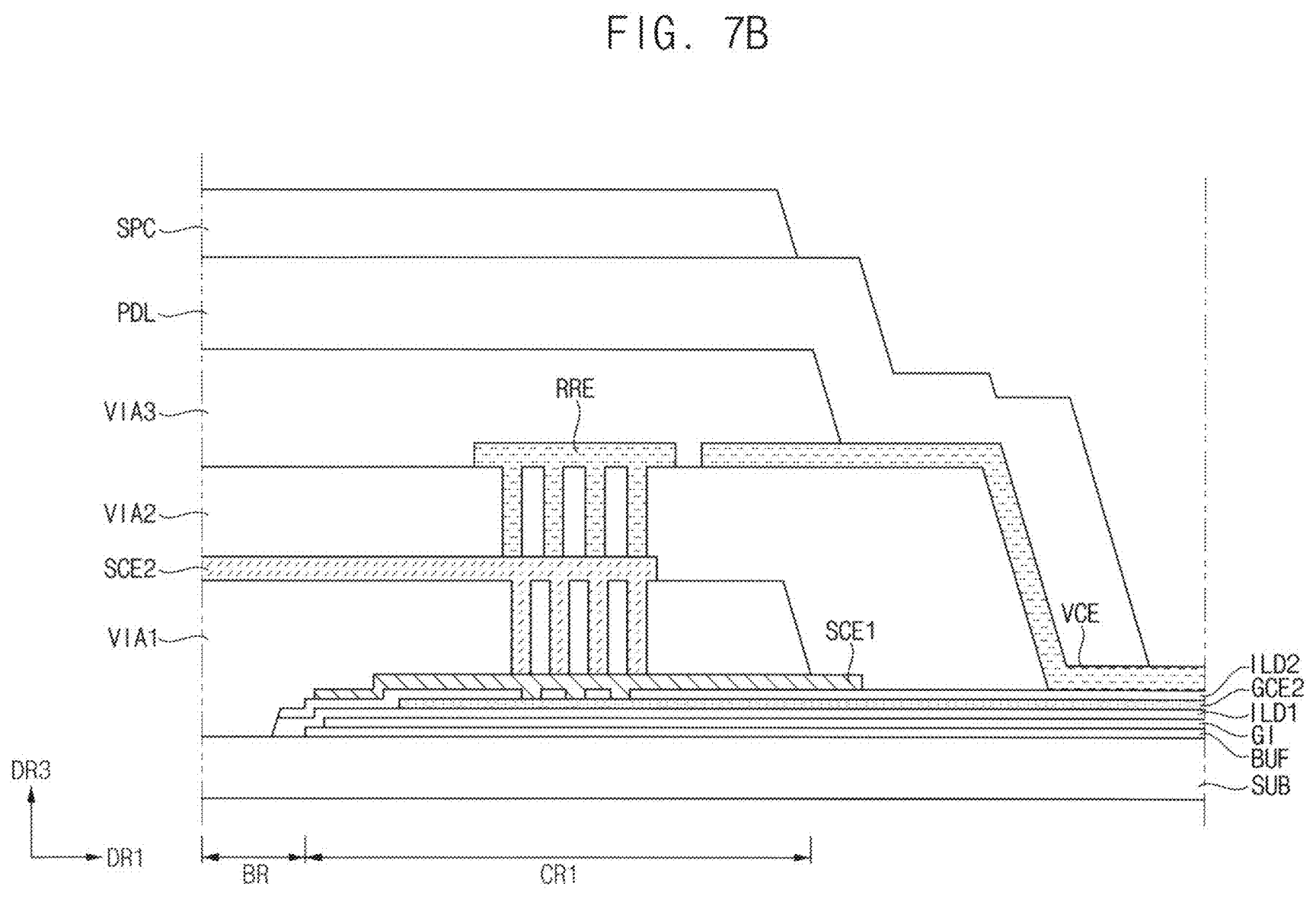

FIG. 7A and FIG. 7B are cross-sectional views illustrating an area of FIG. 3A according to an embodiment. FIG. 7A and FIG. 7B may be substantially the same as FIG. 4A and FIG. 4B, except that a second gate connection line GCE2 is disposed instead of the first gate connection line GCE1. Accordingly, description overlapping will be omitted.

Referring to FIG. 7A and FIG. 7B, the second gate connection line GCE2 may be disposed between the first interlayer insulation layer ILD1 and the second interlayer insulation layer ILD2. The second gate connection line GCE2 may include substantially the same material as the first gate connection line GCE1. The second gate connection line GCE2 may include metal, ally, metal oxide, transparent conductive material. An example of material included in the second gate connection line GCE2 may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The second gate connection line GCE2 may be electrically connected to the first source connection line SCE1 by a contact hole. The second gate connection line GCE2 may extend in the first direction DR1 from the first contact area CR1. That is, the second gate connection line GCE2 may extend toward the display area DA, such as to be connected to a pixel PX of the display area DA.

As shown in FIG. 7A, an area where the first source connection line SCE1 is connected to the second source connection line SCE2 by a contact hole may not overlap an area where the first connection line SCE1 is connected to the second gate connection line GCE2.

Alternatively, as shown in FIG. 7B, the area where the first source connection line SCE1 is connected to the second source connection line SCE2 by a contact hole may overlap the area where the first connection line SCE1 is connected to the second gate connection line GCE2.

Figure 8A:
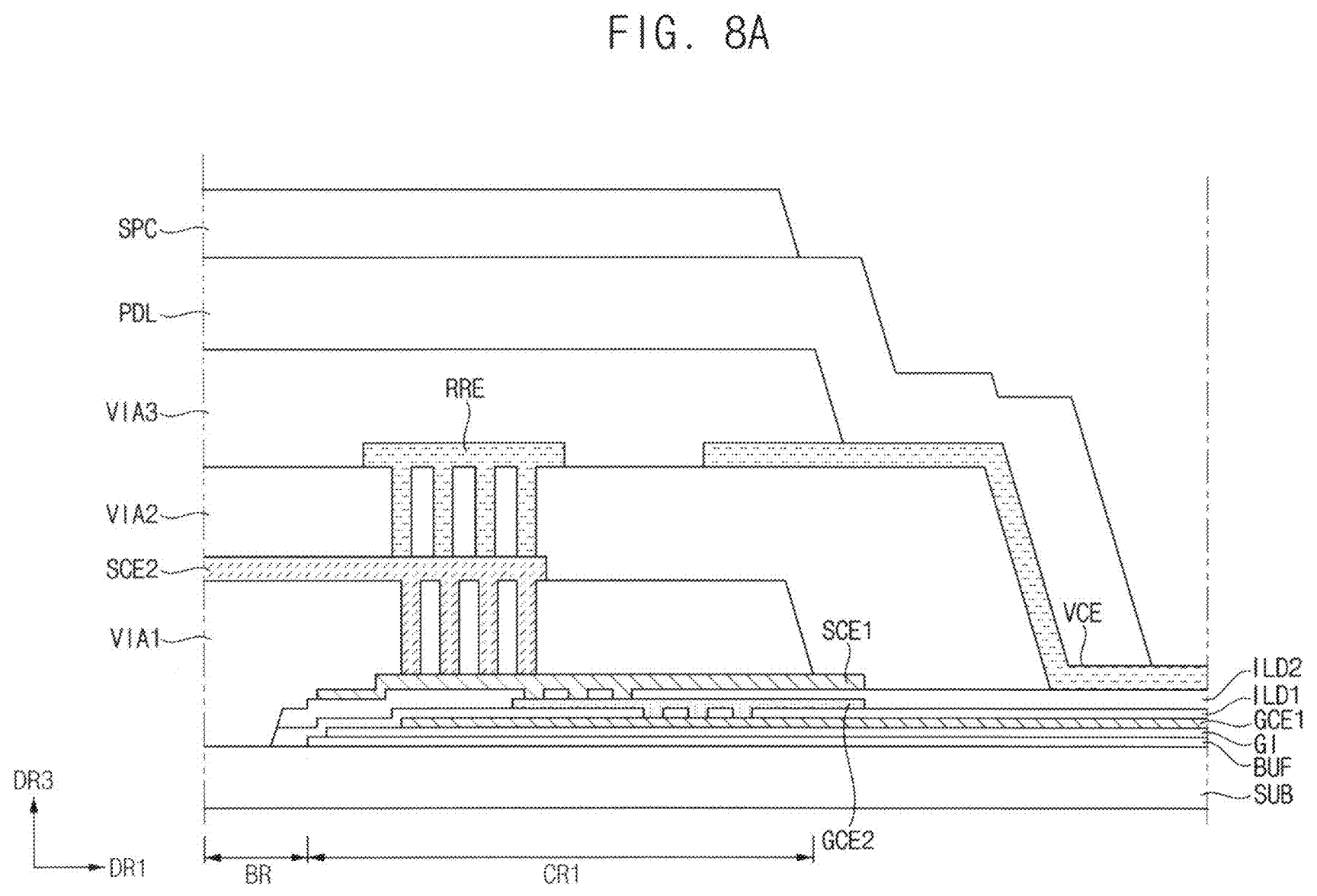
Figure 8B:
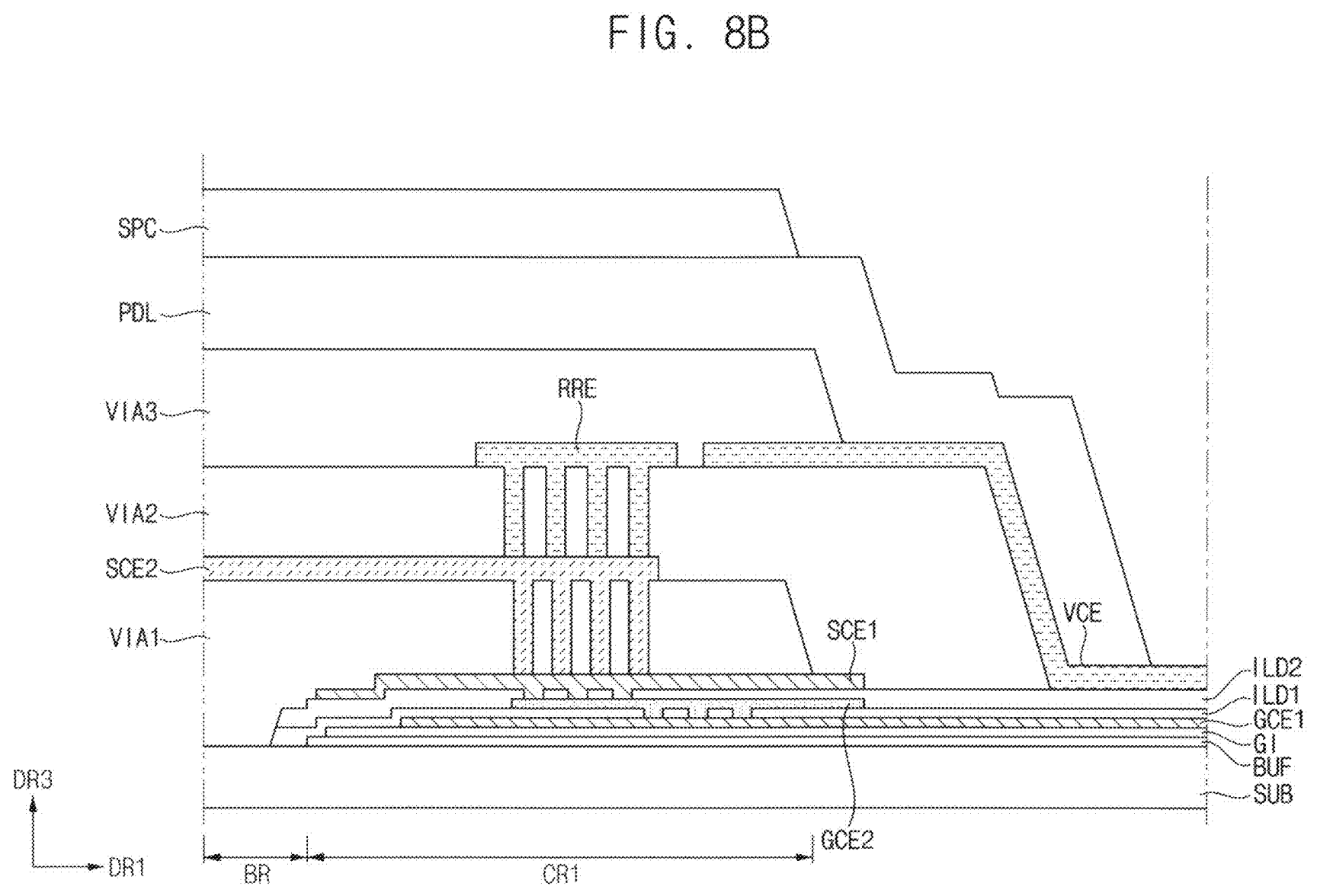

FIG. 8A and FIG. 8B are cross-sectional views illustrating an area of FIG. 3A according to an embodiment. FIG. 8A and FIG. 8B may be substantially the same as FIG. 4A and FIG. 4B, except that a second gate connection line GCE2 is disposed between the first source connection line SCE1 and the first gate connection line GCE1. Accordingly, description overlapping will be omitted.

Figure 9A:
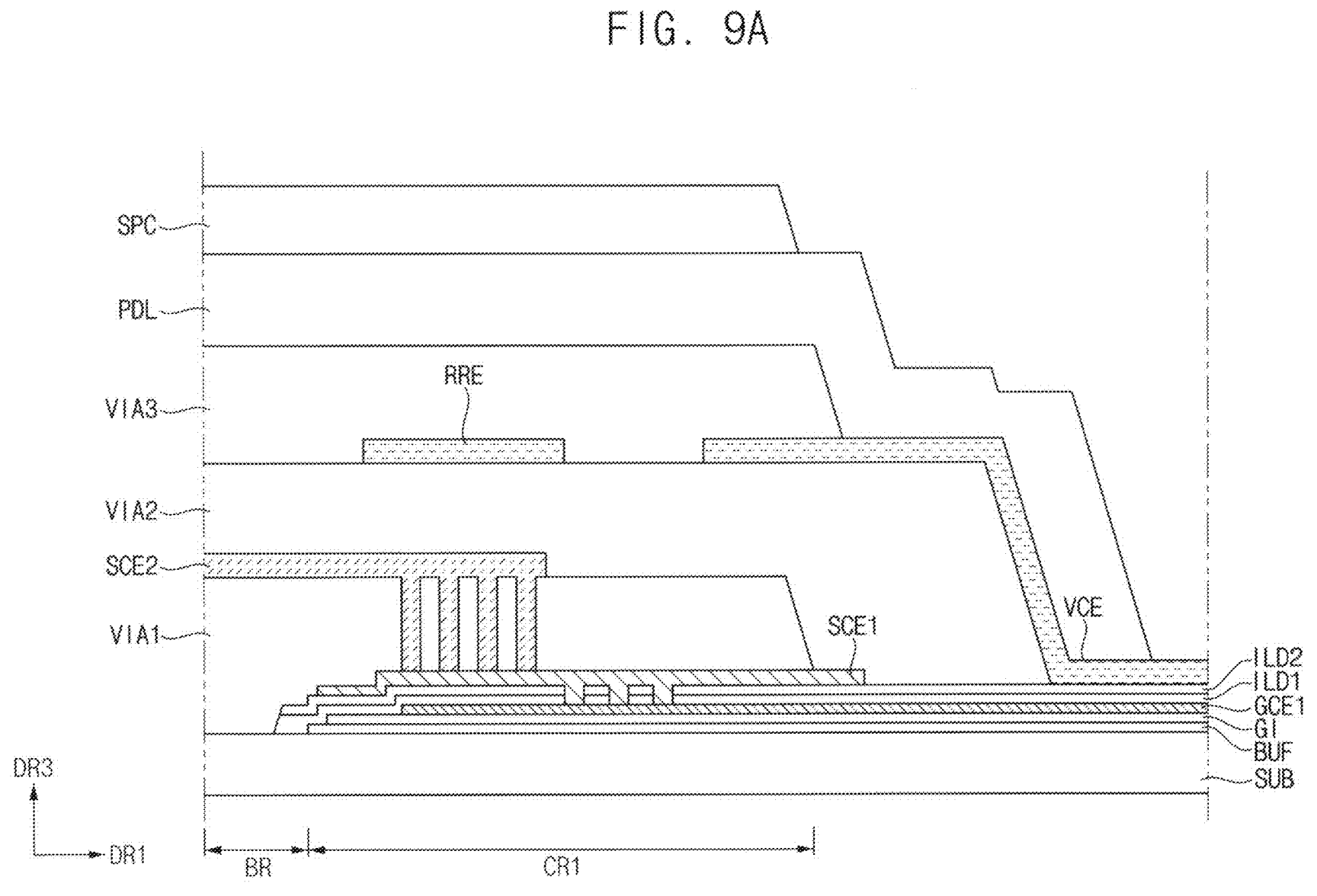
Figure 9B:
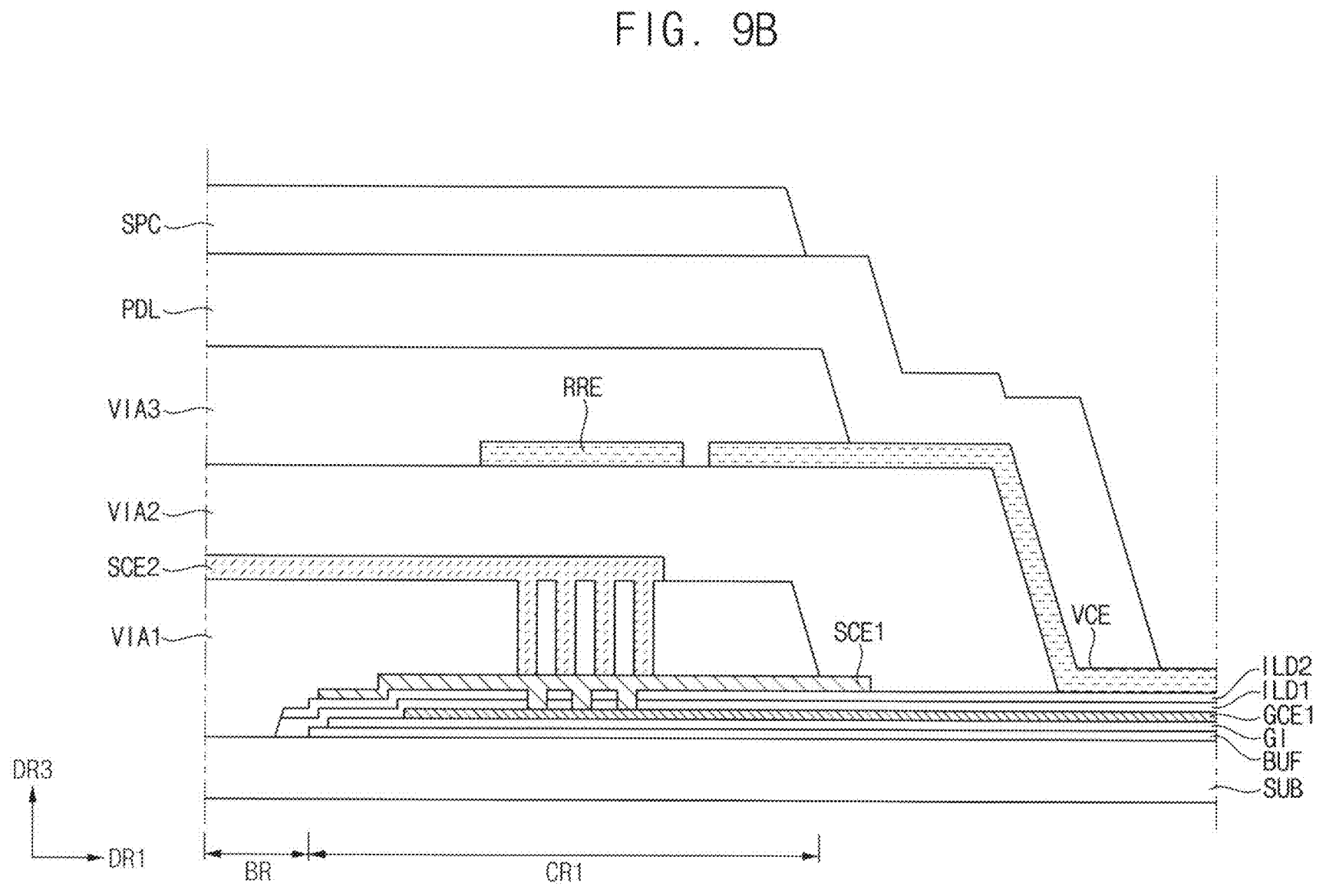

FIG. 9A and FIG. 9B are cross-sectional views illustrating an area of FIG. 3A according to an embodiment. FIG. 9A and FIG. 9B may be substantially the same as FIG. 4A and FIG. 4B, except that the blocking line RRE is not connected to the second source connection line SCE2. Accordingly, description overlapping will be omitted.

Referring to FIG. 3B, FIG. 3D, FIG. 3E, FIG. 3G, FIG. 9A, and FIG. 9B, the blocking line RRE may not be connected to the second source connection line SCE2. In this case, the blocking line RRE may prevent impurities from penetrating into the second source connection line SCE2.

Figure 10A:
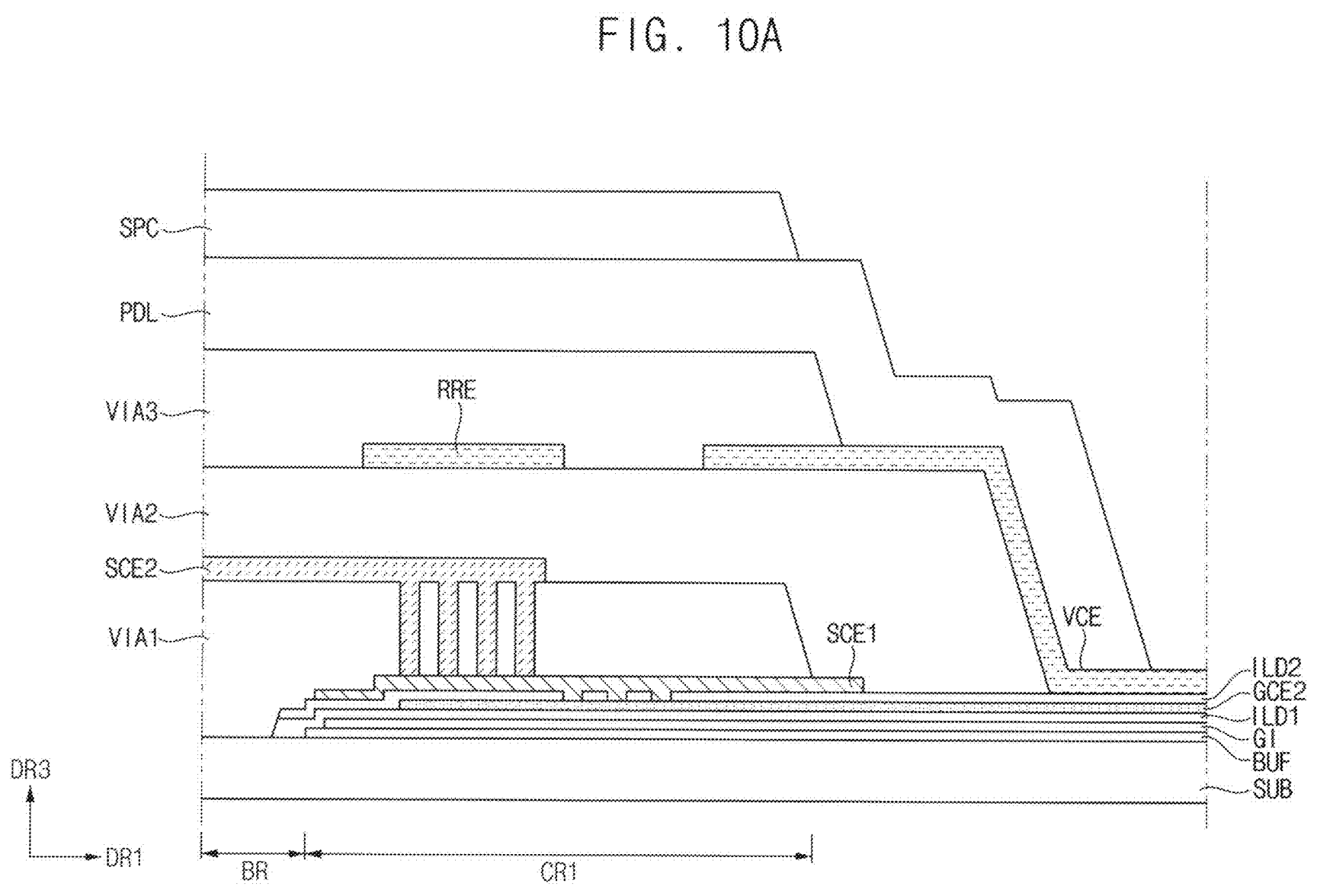
Figure 10B:
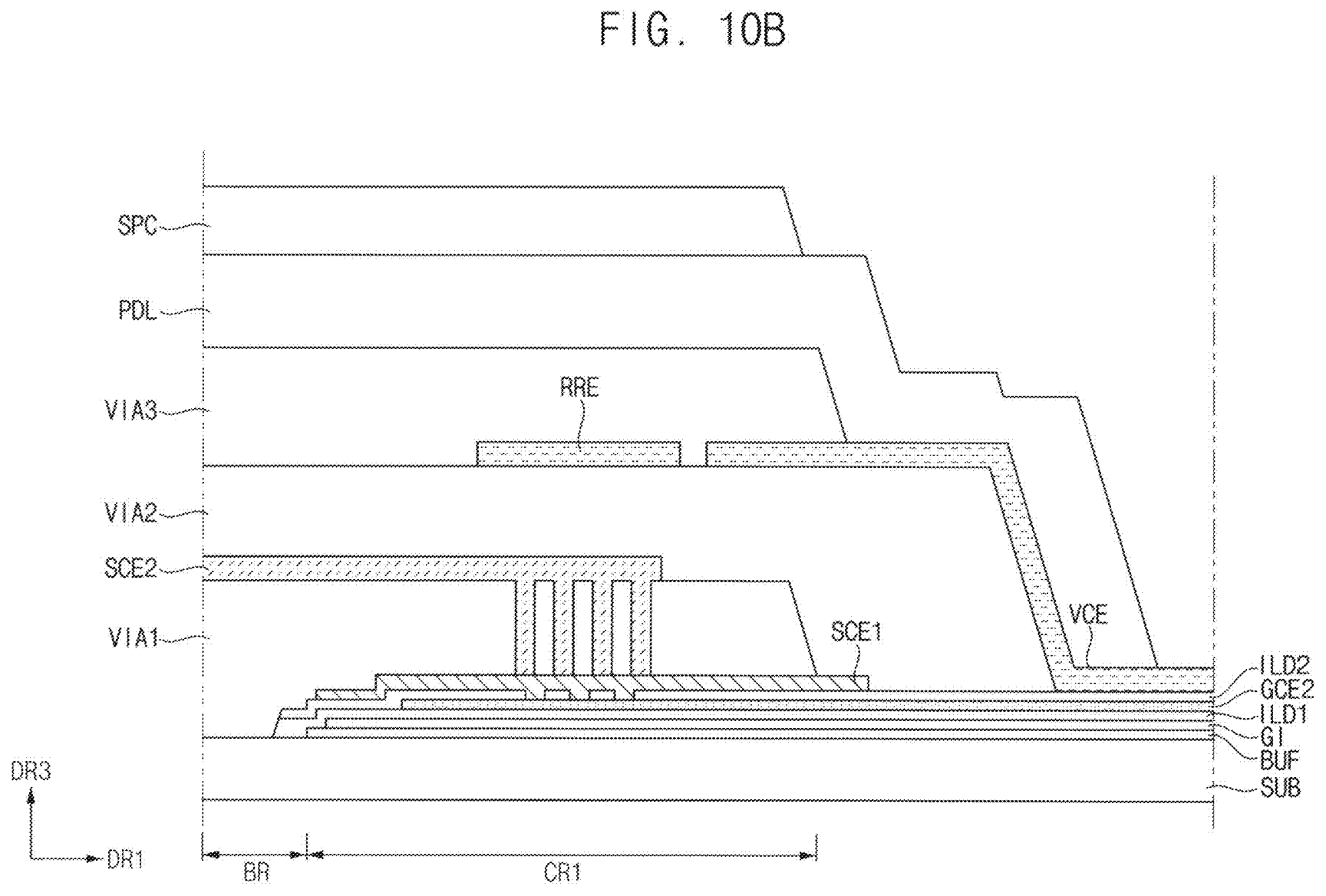

FIG. 10A and FIG. 10B are cross-sectional views illustrating an area of FIG. 3A according to an embodiment. FIG. 10A and FIG. 10B may be substantially the same as FIG. 9A and FIG. 9B, except that the second gate connection line GCE2 is disposed instead of the first gate connection line GCE1. Accordingly, description overlapping will be omitted.

Figure 11A:
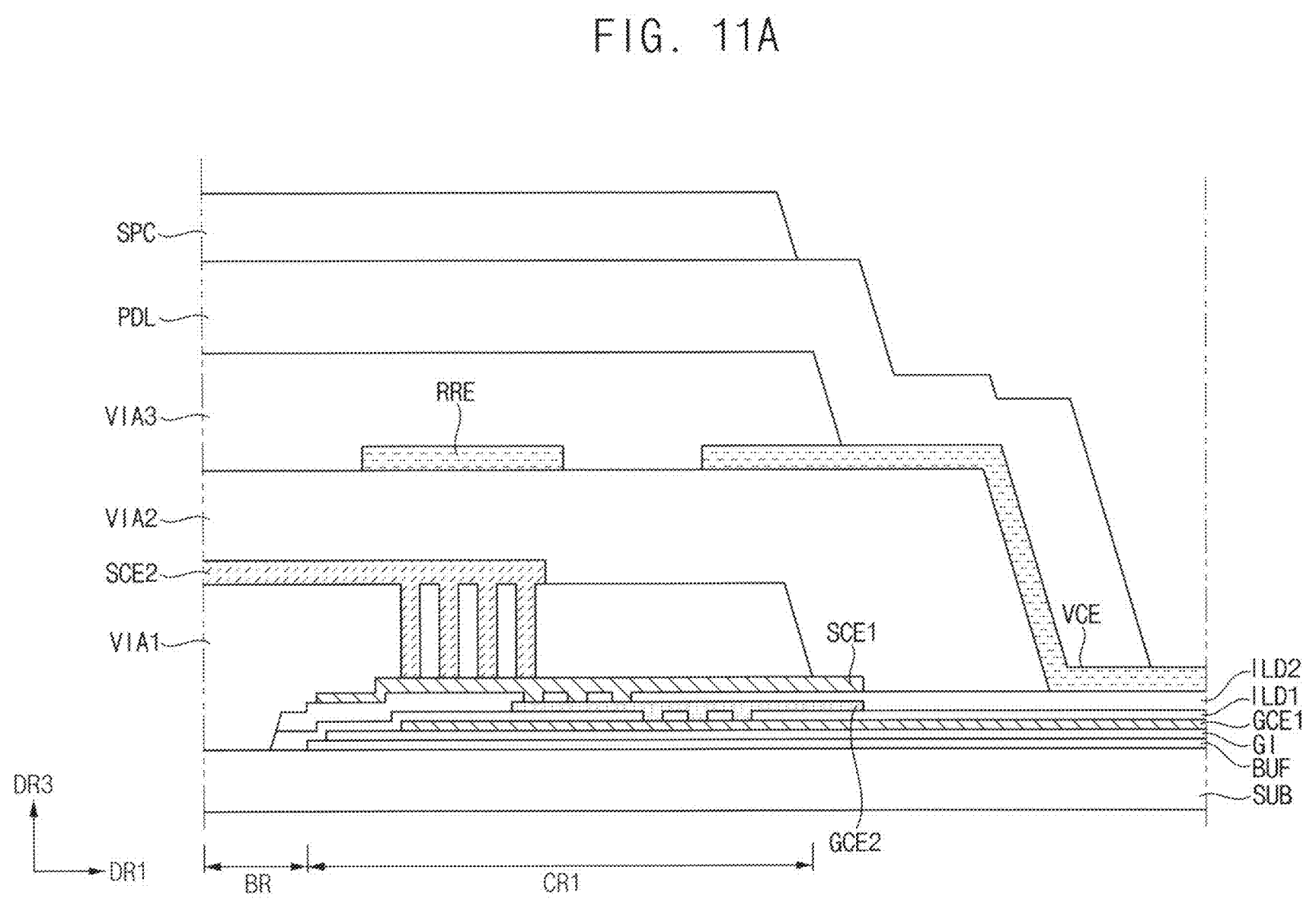
Figure 11B:
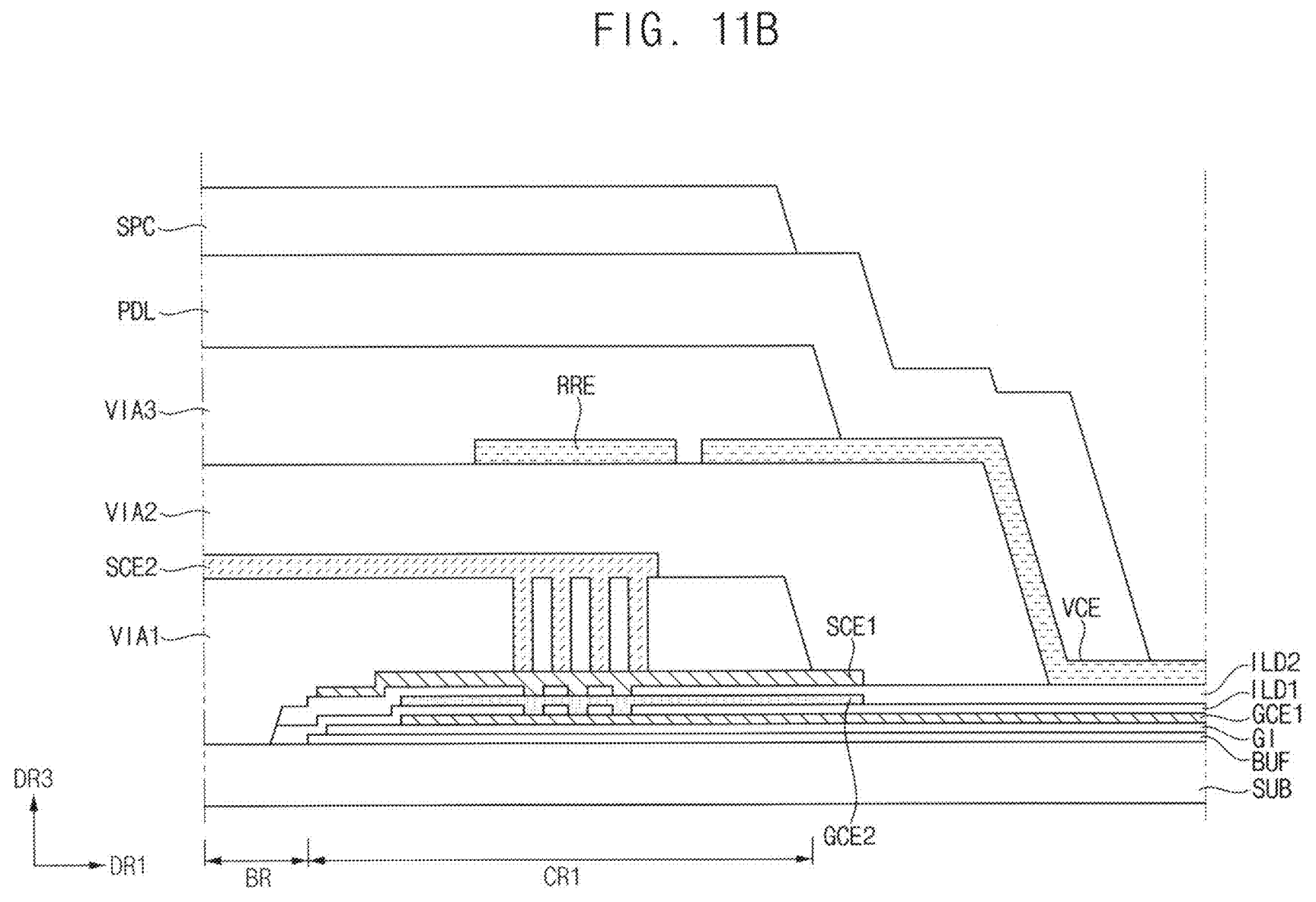

FIG. 11A and FIG. 11B are cross-sectional views illustrating an area of FIG. 3A according to an embodiment. FIG. 11A and FIG. 11B may be substantially the same as FIG. 9A and FIG. 9B, except that the second gate connection line GCE2 is disposed between the first source connection line SCE1 and the first gate connection line GCE1. Accordingly, description overlapping will be omitted.

Figure 12A:
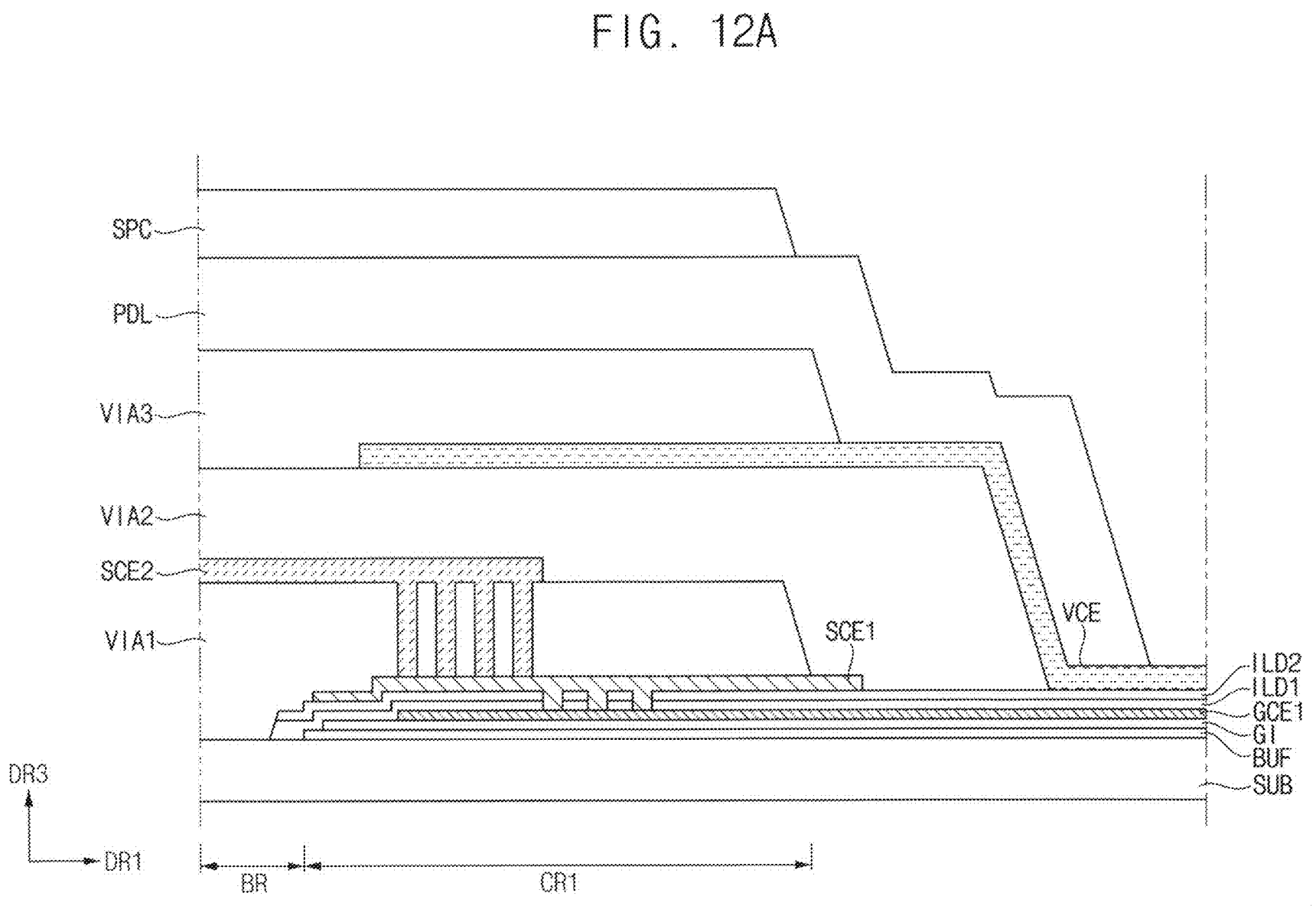
Figure 12B:
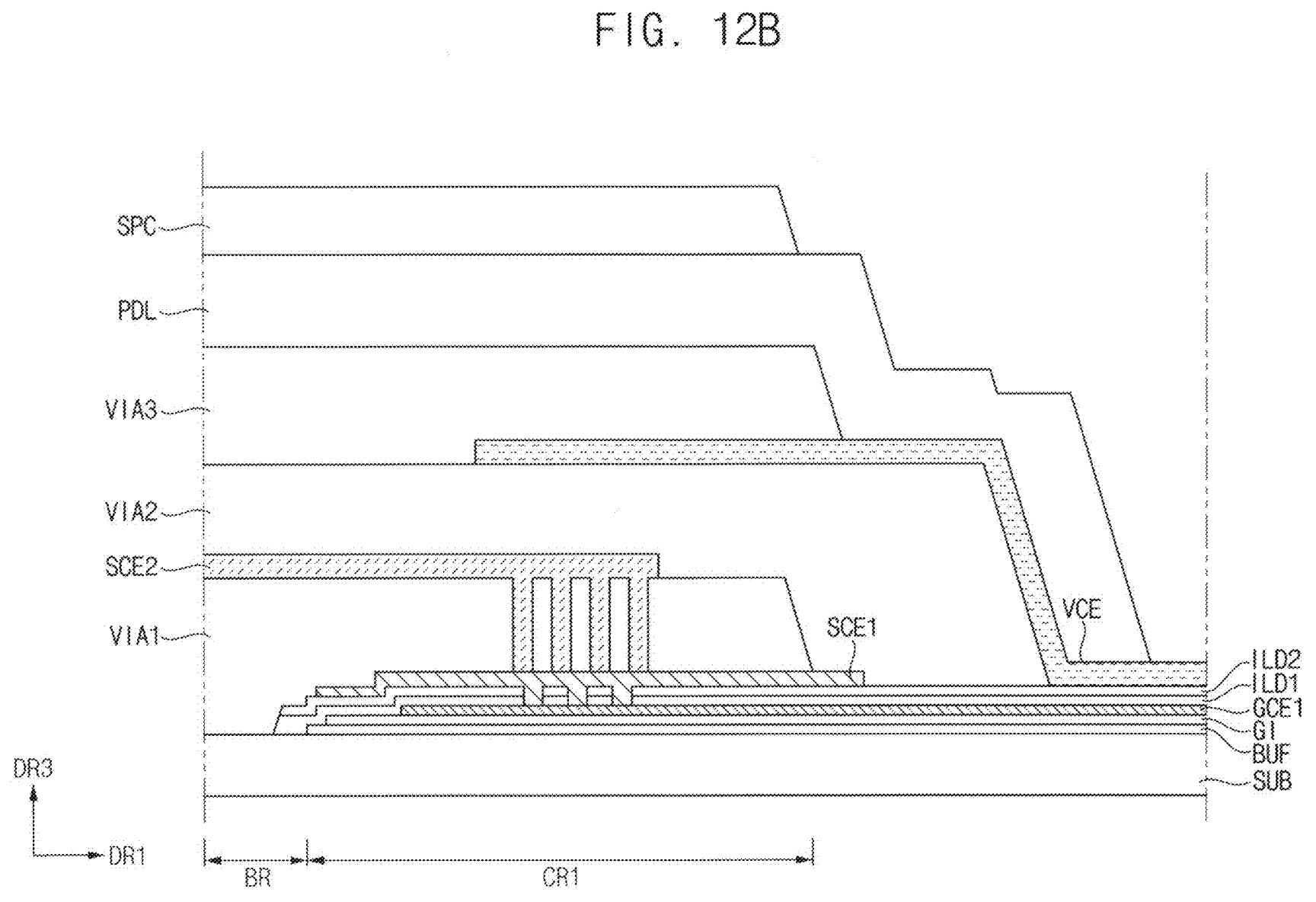

FIG. 12A and FIG. 12B are cross-sectional views illustrating an area of FIG. 3A according to an embodiment. FIG. 12A and FIG. 12B may be substantially the same as FIG. 4A and FIG. 4B, except that the blocking line RRE is not disposed, and the voltage line VCE partially overlaps the second source connection line SCE2. Accordingly, description overlapping will be omitted.

Referring to FIG. 12A and FIG. 12B, the voltage line VCE may be disposed outside of the first contact area CR1 and extend from outside of the first contact area CR1 and into the first contact area CR1 to partially overlap the second source connection line SCE2. In this case, the voltage line VCE may prevent impurities from penetrating into the second source connection line SCE2. In this case, an extended portion of the voltage line VCE which is in the first contact area CR1 may define the blocking line RRE.

Figure 13A:
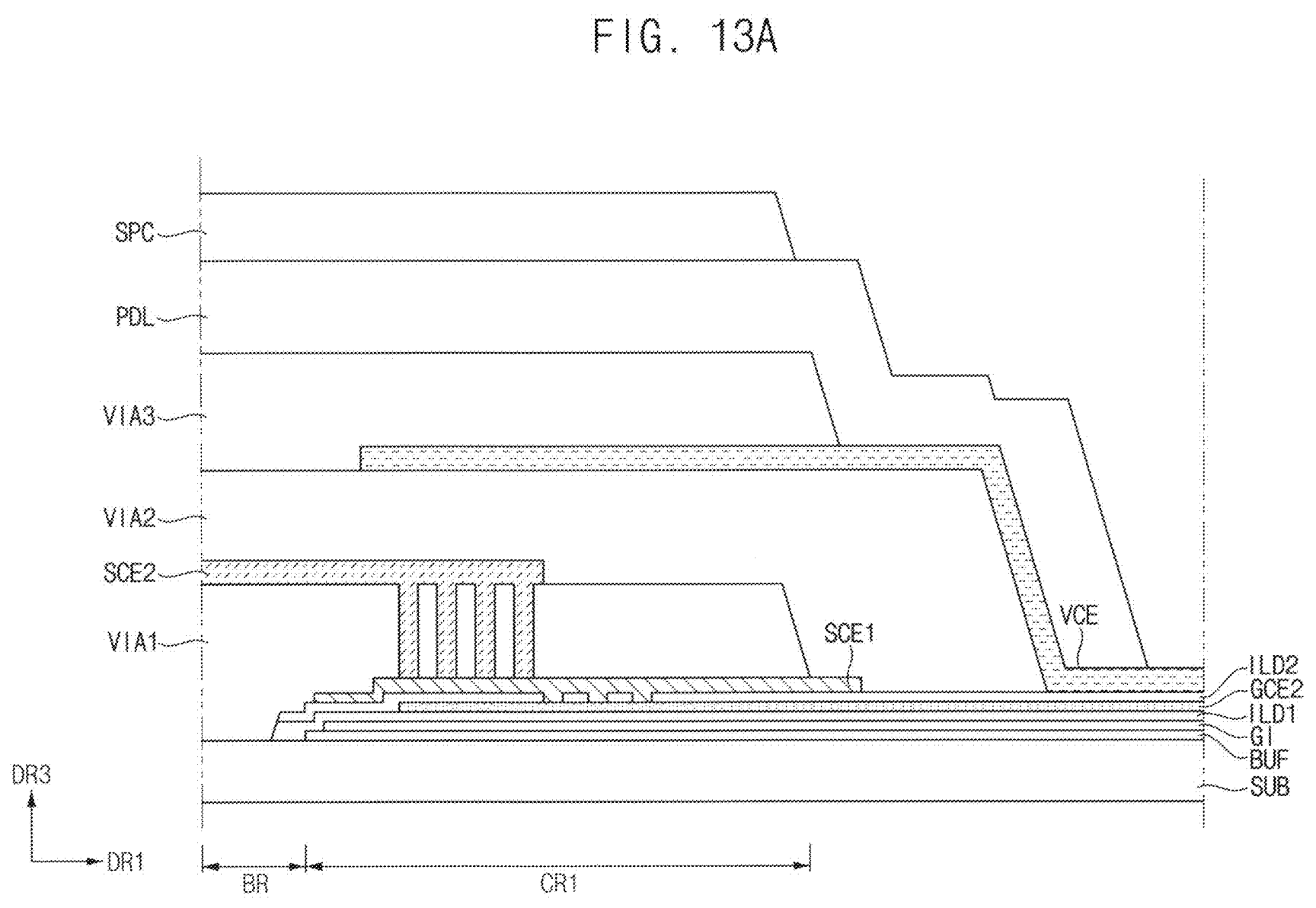
Figure 13B:
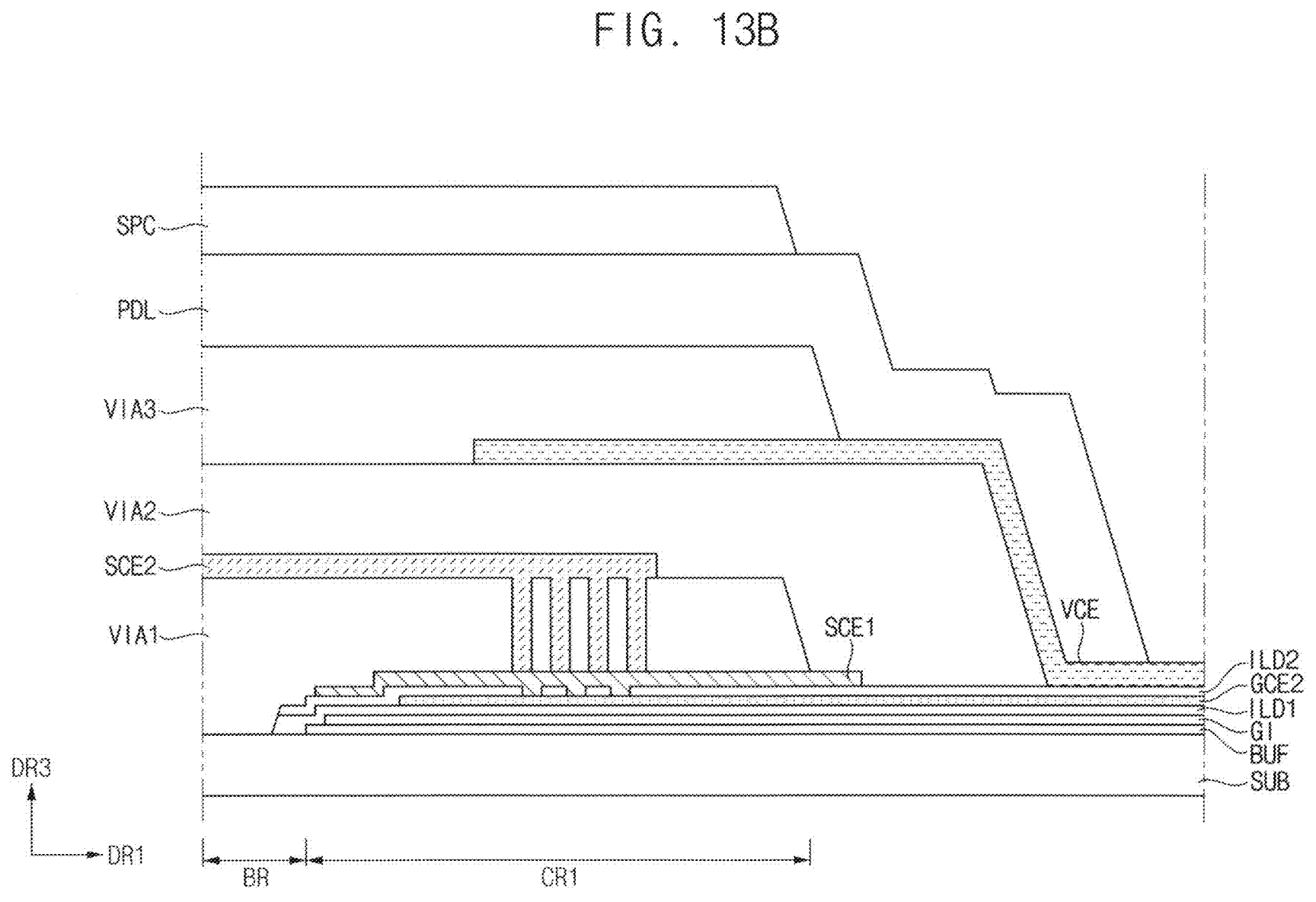

FIG. 13A and FIG. 13B are cross-sectional views illustrating an area of FIG. 3A according to an embodiment. FIG. 13A and FIG. 13B may be substantially the same as FIG. 12A and FIG. 12B, except that the second gate connection line GCE2 is disposed instead of the first gate connection line GCE1. Accordingly, description overlapping will be omitted.

Figure 14A:
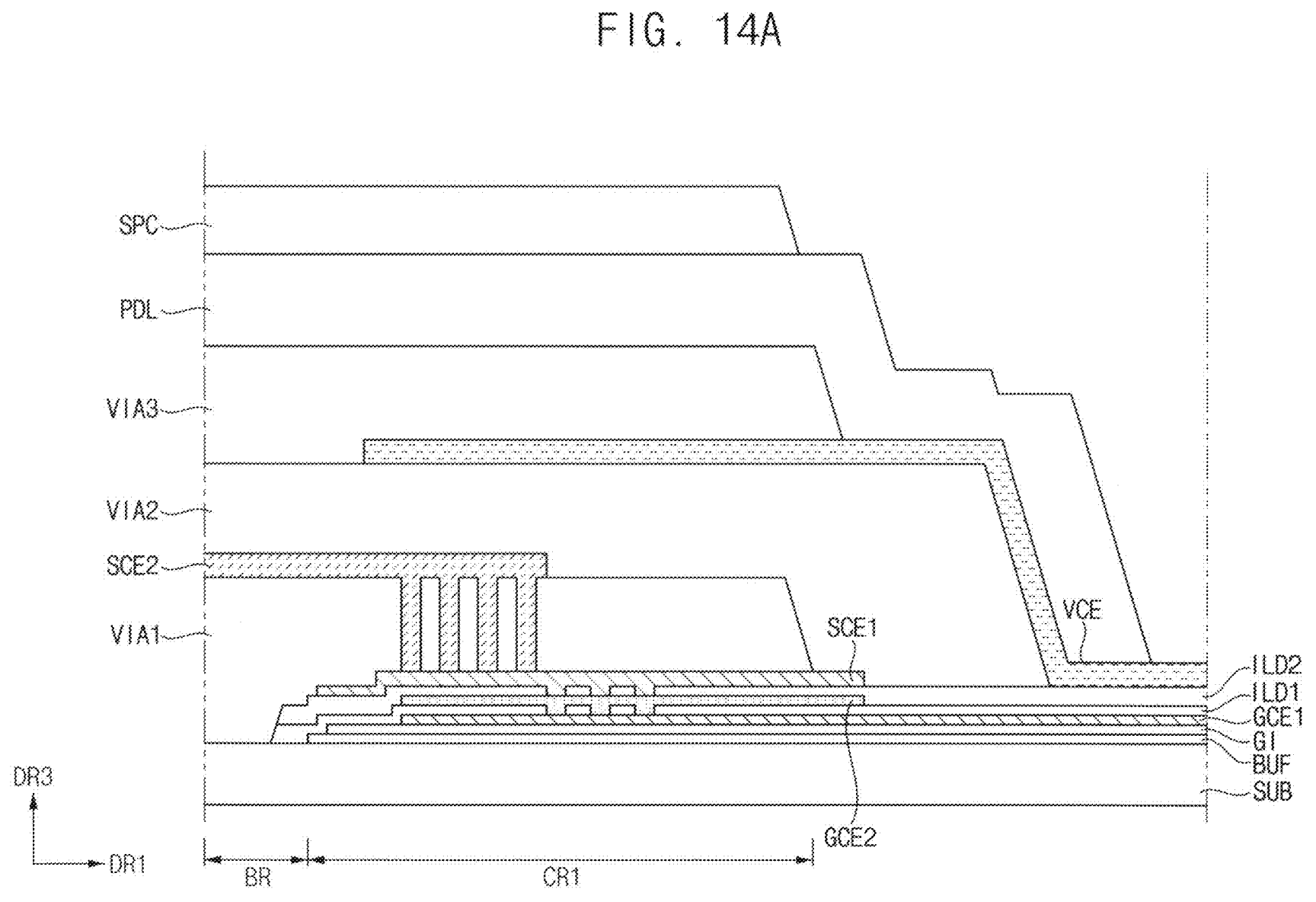
Figure 14B:
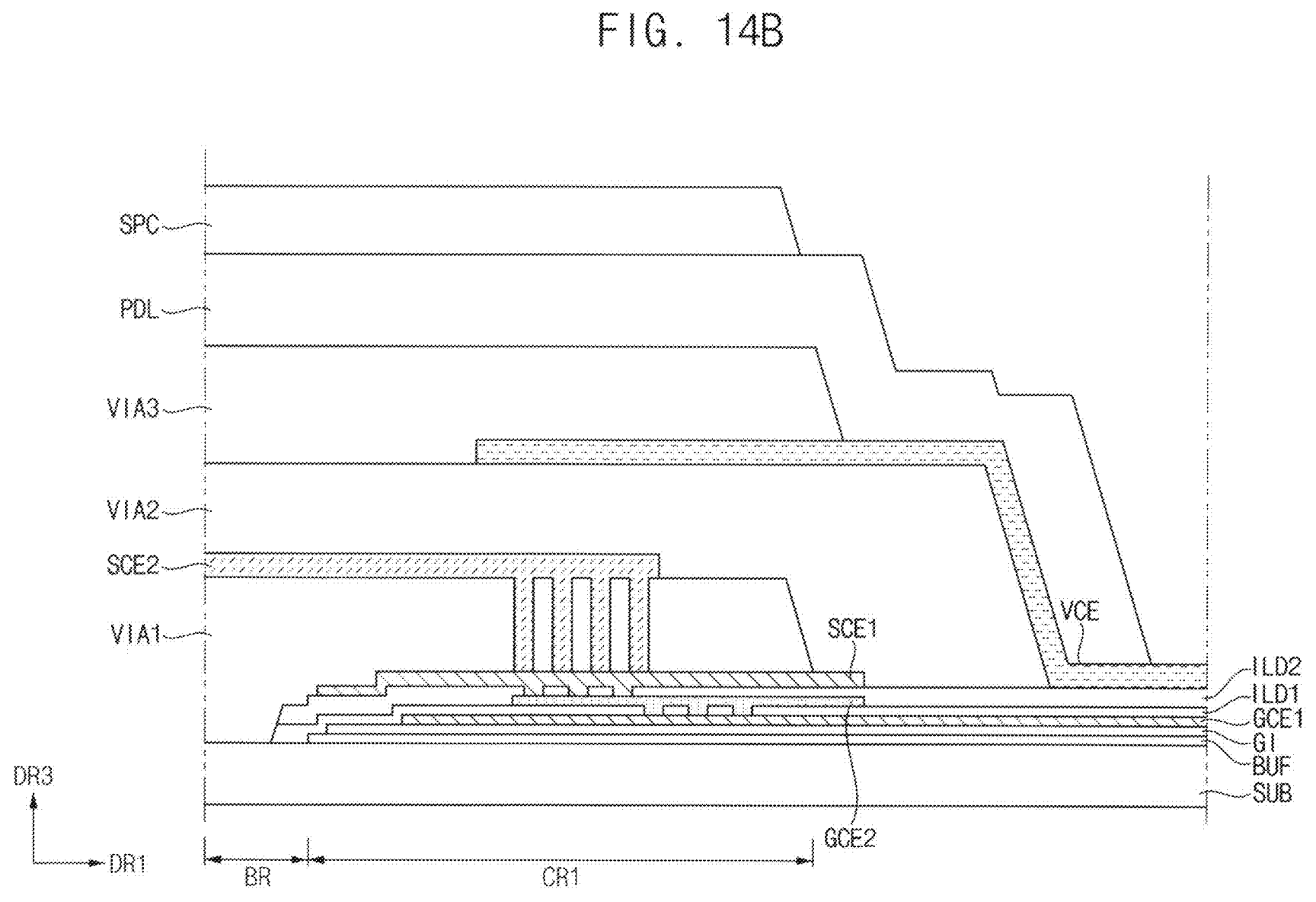

FIG. 14A and FIG. 14B are cross-sectional views illustrating an area of FIG. 3A according to an embodiment. FIG. 14A and FIG. 14B may be substantially the same as FIG. 12A and FIG. 12B, except that the second gate connection line GCE2 is disposed between the first source connection line SCE1 and the first gate connection line GCE1. Accordingly, description overlapping will be omitted.

Although, the above-descriptions have been described with respect to the cross-sectional view of the first contact area CR1, the second contact area CR2 may also have substantially the same structure as the first contact area CR1.

Figure 15:
FIG. 15 is a diagram enlarging a contact area of FIG. 3A.
Figure 16:
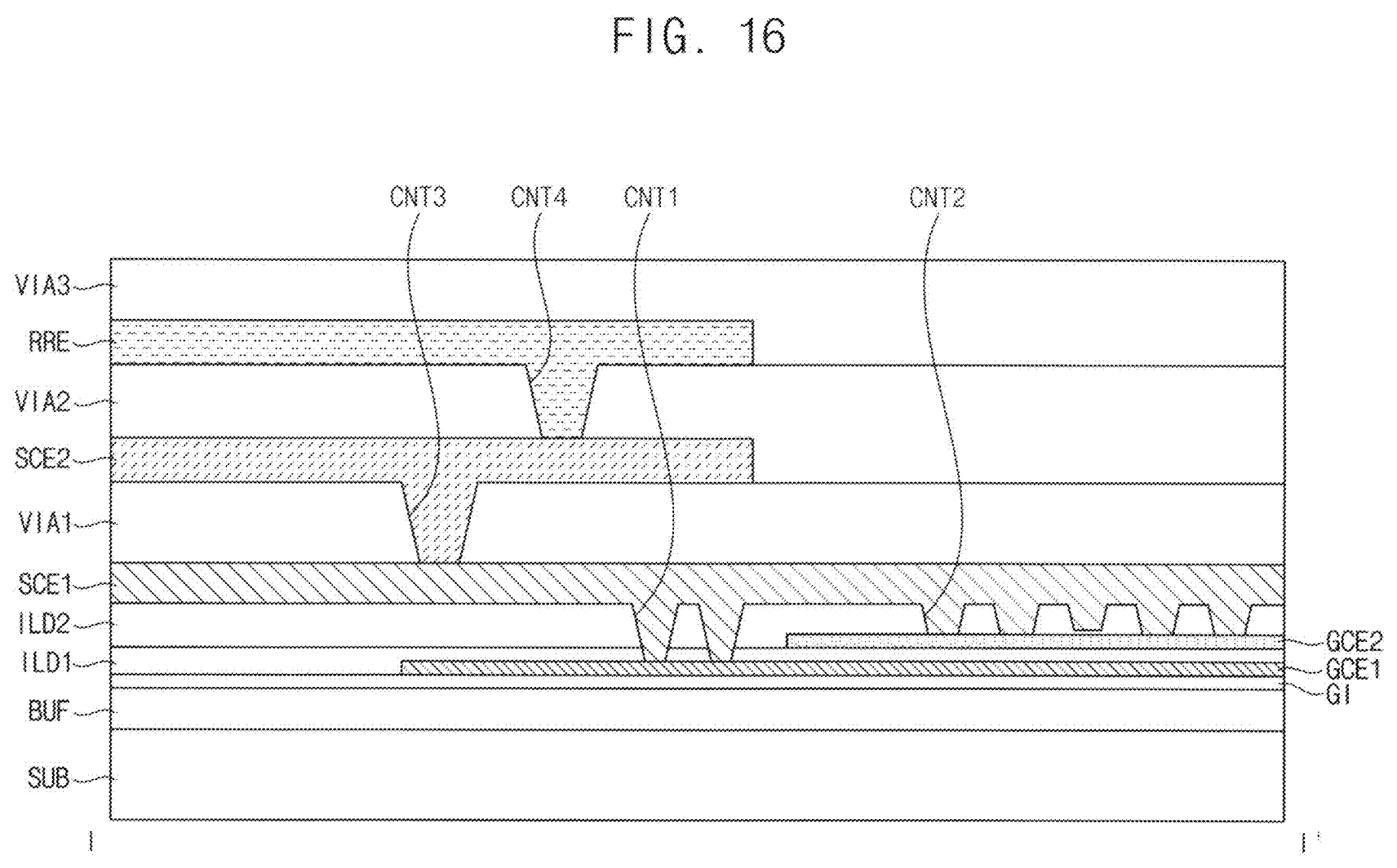

FIG. 15 is a diagram enlarging a contact area of FIG. 3A. FIG. 16 is a cross-sectional view taken along line I-I' of FIG. 15. FIG. 15 is a diagram illustrating the first contact area CR1 of FIG. 3A. A detailed description of the components described with reference to the above figures will be omitted.

Referring to FIG. 3A, FIG. 15 and FIG. 16, a plurality of lines GCE1, GCE2, SCE1, and SCE2 may overlap each other in the first contact area CR1. The blocking line RRE may overlap a portion of the plurality of lines GCE1, GCE2, SCE1, and SCE2 in the first contact area CR1.

Referring to FIG. 15 and FIG. 16, each of the first gate connection line GCE1 and the second gate connection line GCE2 may be connected to a same one of the first source connection line SCE1. Accordingly, signals transmitted by the first source connection line SCE1 may be transmitted through the two different conductive layers GCE1 and GCE2 overlapping each other. The first gate connection line GCE1 and the first source connection line SCE1 may be connected to each other by one or more of a first contact hole CNT1. The second gate connection line GCE2 and the same one of the first source connection line SCE1 may be connected to each other by one or more of a second contact hole CNT2. The first source connection line SCE1 and the second source connection line SCE2 may be connected to each other by one or more of a third contact hole CNT3. The second source connection line SCE2 and the blocking line RRE may be connected to each other by one or more of a fourth contact hole CNT4.

As described above, since the third contact hole CNT3 and the fourth contact hole CNT4 are formed to be separated from each other, a length of the first contact area CR1 may decrease.

FIG. 15 and FIG. 16 are described with reference to the first contact area CR1, the same may be applied to the second contact area CR2.

Figure 17:
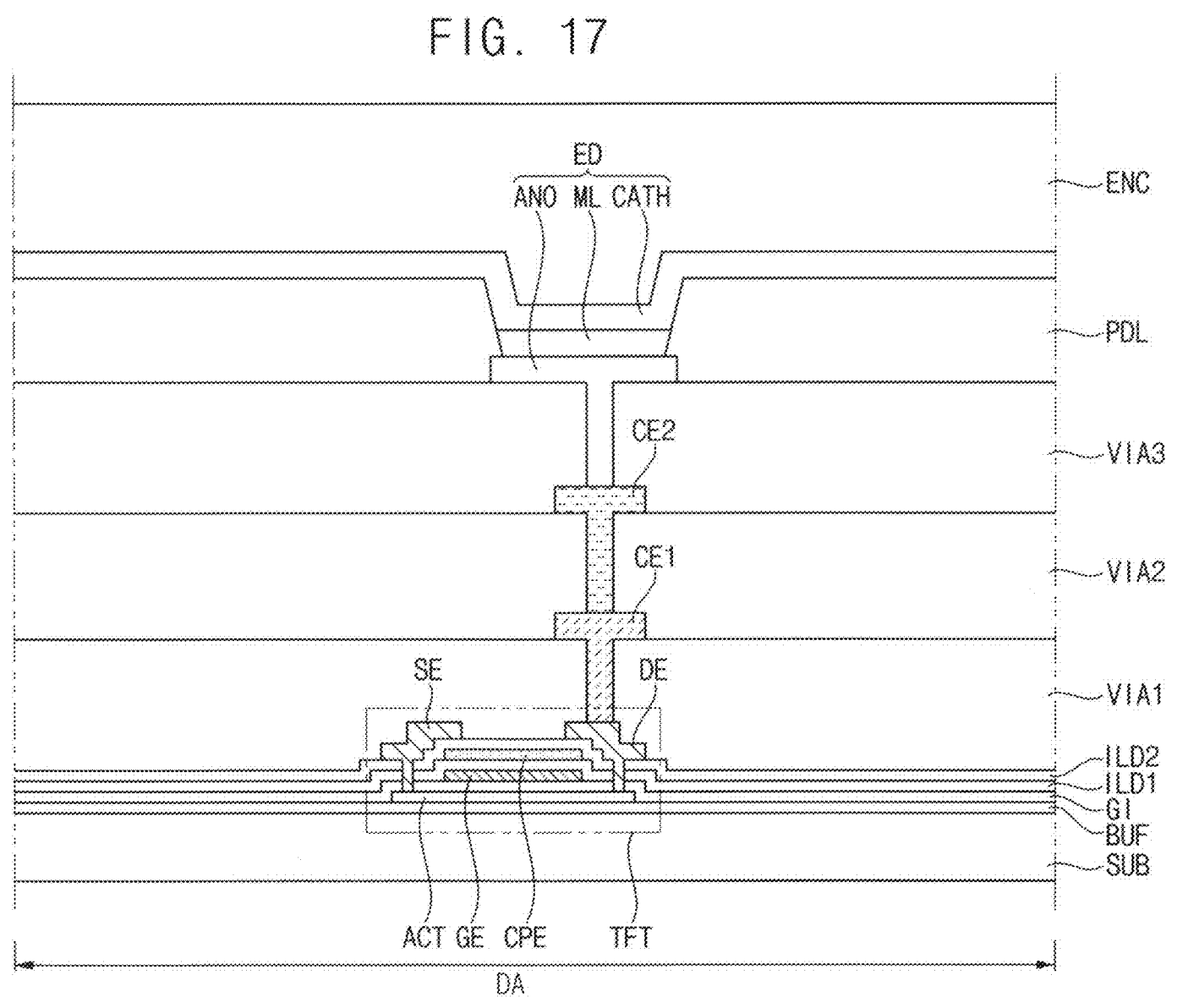

FIG. 17 is a cross-sectional view illustrating a pixel P included in the display device DD of FIG. 1A.

Referring to FIG. 1A and FIG. 17, the display device DD may include the substrate SUB, the buffer layer BUF, the gate insulation layer GI, the first interlayer insulation layer ILD1, the second interlayer insulation layer ILD2, the first via insulation layer VIA1, the second via insulation layer VIA2, the third via insulation layer VIA3, a capacitor electrode CPE, a first connection electrode CE1, a second connection electrode CE2, the pixel defining layer PDL, a capping layer ENC, a transistor TFT, and an light emitting element ED.

The transistor TFT may include an active layer ACT, a gate electrode GE, a source electrode SE, and a drain electrode DE. The light emitting element ED may include an anode electrode ANO, a middle layer ML, and a cathode electrode CATH.

The substrate SUB may include plastic and may have flexibility. Accordingly, the substrate SUB may be bent in the bending area BR. Alternatively, the substrate SUB may include glass. In this case, the glass may have flexibility by patterning in the bending area.

The buffer layer BUF may be disposed on the substrate SUB. The buffer layer BUF may include an inorganic insulation material. An example of material included in the buffer layer BUF may be $SiO_x$, $SiN_x$, SiON, etc. These may be used alone or in combination with each other. The buffer layer BUF may prevent metal atoms or impurities from spreading upward.

The active layer may be disposed on the buffer layer BUF. In embodiments, the active layer ACT may include a silicon semiconductor. An example of the silicon semiconductor may be amorphous silicon, polycrystalline silicon, etc. Alternatively, in embodiments, the active layer ACT may include an oxide semiconductor. An example of the oxide semiconductor may be IGZO, IGO, IZO, etc.

The gate insulation layer GI may be disposed on the buffer layer BUF. The gate insulation layer GI may cover the active layer ACT. The gate insulation layer GI may include an inorganic insulation layer. An example of material included in the gate insulation layer GI may be $SiO_x$, $SiN_x$, SiON, etc. These may be used alone or in combination with each other.

The gate electrode GE may be disposed on the gate insulation layer GI. The gate electrode GE may be simultaneously formed by the same process as the first gate connection line GCE1. The gate electrode GE may partially overlap the active layer ACT. In response to the gate signal provided to the gate electrode GE, a signal and/or a voltage may flow through the active layer ACT. The gate electrode GE may include metal, alloy, metal oxide, transparent conductive material, etc. An example of material included in the gate electrode GE may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The first interlayer insulation layer ILD1 may be disposed on the gate insulation layer GI to cover the gate electrode GE. In an embodiment, the first interlayer insulation layer ILD1 may include an inorganic insulation material. An example of material included in the first interlayer insulation layer ILD1 may be $SiO_x$, $SiN_x$, SiON, etc. These may be used alone or in combination with each other.

The capacitor electrode CPE may be disposed on the first interlayer insulation layer ILD1. The capacitor electrode CPE may overlap the gate electrode GE. In this case, the capacitor electrode CPE and the gate electrode GE may define a capacitor. The capacitor electrode CPE may be simultaneously formed by the same process as the second gate connection line GCE2. In an embodiment, the capacitor electrode CPE may include metal, alloy, metal oxide, transparent conductive material, etc. An example of material included in the capacitor electrode CPE may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The second interlayer insulation layer ILD2 may be disposed on the first interlayer insulation layer ILD1. The second interlayer insulation layer ILD2 may cover the capacitor electrode CPE. The second interlayer insulation layer ILD2 may include an inorganic insulation material. An example of material included in the second interlayer insulation layer ILD1 may be $SiO_x$, $SiN_x$, SiON, etc. These may be used alone or in combination with each other.

The source electrode SE and the drain electrode DE may be disposed on the second interlayer insulation layer ILD2. The source electrode SE and the drain electrode DE may be formed by the same process as the first source connection line SCE1. Each of the source electrode SE and the drain electrode DE may be connected to the active layer ACT through a contact hole. In an embodiment, each of the source electrode SE and the drain electrode DE may include metal, alloy, metal oxide, transparent conductive material, etc. An example of material included in the source electrode SE and the drain electrode DE may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The first via insulation layer VIA1 may be disposed on the second interlayer insulation layer ILD2. The first via insulation layer VIA1 may cover the source electrode SE and the drain electrode DE. An upper surface of the first via insulation layer VIA1 may be substantially flat. In an embodiment, the first via insulation layer VIA1 may include an organic insulation material. An example of material included in the first via insulation layer VIA1 may be photoresist, polyacrylic resin, polyimide resin, acrylic resin, etc. These may be used alone or in combination with each other.

The first connection electrode CE1 may be disposed on the first via insulation layer VIA1. The first connection electrode CE1 may be electrically connected to the drain electrode DE by a contact hole. The first connection electrode CE1 may be formed by the same process as the second source connection line SCE2. The first connection electrode CE1 may include metal, alloy, metal oxide, transparent conductive material, etc. An example of material included in the first connection electrode CE1 may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The second via insulation layer VIA2 may be disposed on the first via insulation layer VIA1. The second via insulation layer VIA2 may cover the first connection electrode CE1. An upper surface of the second via insulation layer VIA2 may be substantially flat. The second via insulation layer VIA2 may include an organic insulation material. An example of material included in the second via insulation layer VIA2 may be photoresist, polyacrylic resin, polyimide resin, acrylic resin, etc. These may be used alone or in combination with each other.

The second connection electrode CE2 may be disposed on the second via insulation layer VIA2. The second connection electrode CE2 may be formed by the same process as the blocking line RRE and the voltage line VCE. The second connection electrode CE2 may include metal, alloy, metal oxide, transparent conductive material, etc. An example of material included in the second connection electrode CE2 may be Ag, alloy including Ag, Mo, alloy including Mo, Al, alloy including Al, AlN, W, WN, Cu, Ni, Cr, CrN, Ti, Ta, Pt, Sc, ITO, IZO, etc. These may be used alone or in combination with each other.

The third via insulation layer VIA3 may be disposed on the second via insulation layer VIA2. The third via insulation layer VIA3 may cover the second connection electrode CE2. An upper surface of the third via insulation layer VIA3 may be substantially flat. The third via insulation layer VIA3 may include an organic insulation material. An example of material included in the third via insulation layer VIA3 may be photoresist, polyacrylic resin, polyimide resin, acrylic resin, etc. These may be used alone or in combination with each other.

The anode electrode ANO may be disposed on the third via insulation layer VIA3. The anode electrode ANO may be electrically connected to the second connection electrode CE2 by a contact hole. The anode electrode ANO may include transparent conductive oxide. An example of material included in the anode electrode ANO may be ITO, IZO, ZnO, AZO, In$_2$O$_3$, etc. These may be used alone or in combination with each other.

The pixel defining layer PDL may be disposed on the third via insulation layer VIA3. The pixel defining layer PDL may define an opening exposing the anode electrode ANO to outside the pixel defining layer PDL. In an embodiment, the pixel defining layer PDL may include an organic insulation material. An example of material included in the pixel defining layer PDL may be photoresist, polyacrylic resin, polyimide resin, acrylic resin, etc. These may be used alone or in combination with each other.

The middle layer ML may be disposed on the anode electrode ANO. The middle layer ML may include an organic material emitting light of predetermined color. The middle layer ML may emit light based on a potential (e.g., electrical potential) difference between the anode electrode ANO and the cathode electrode CATH. The middle layer ML may include an electron injection layer, an electron transport layer, a light emitting layer, a hole transport layer, and a hole injection layer.

The cathode electrode CATH may be disposed to cover the middle layer ML and the pixel defining layer PDL. An example of material included in the cathode electrode CATH may include Mg, Ag, Au, Ca, Li, Cr, Cu, Al, etc. These may be used alone or in combination with each other.

The capping layer ENC may be disposed on the cathode electrode CATH. The capping layer ENC may protect the light emitting element ED and components disposed under the light emitting element ED. The capping layer ENC may have a structure in which an inorganic layer, an organic layer and an inorganic layer are stacked.

Figure 18:
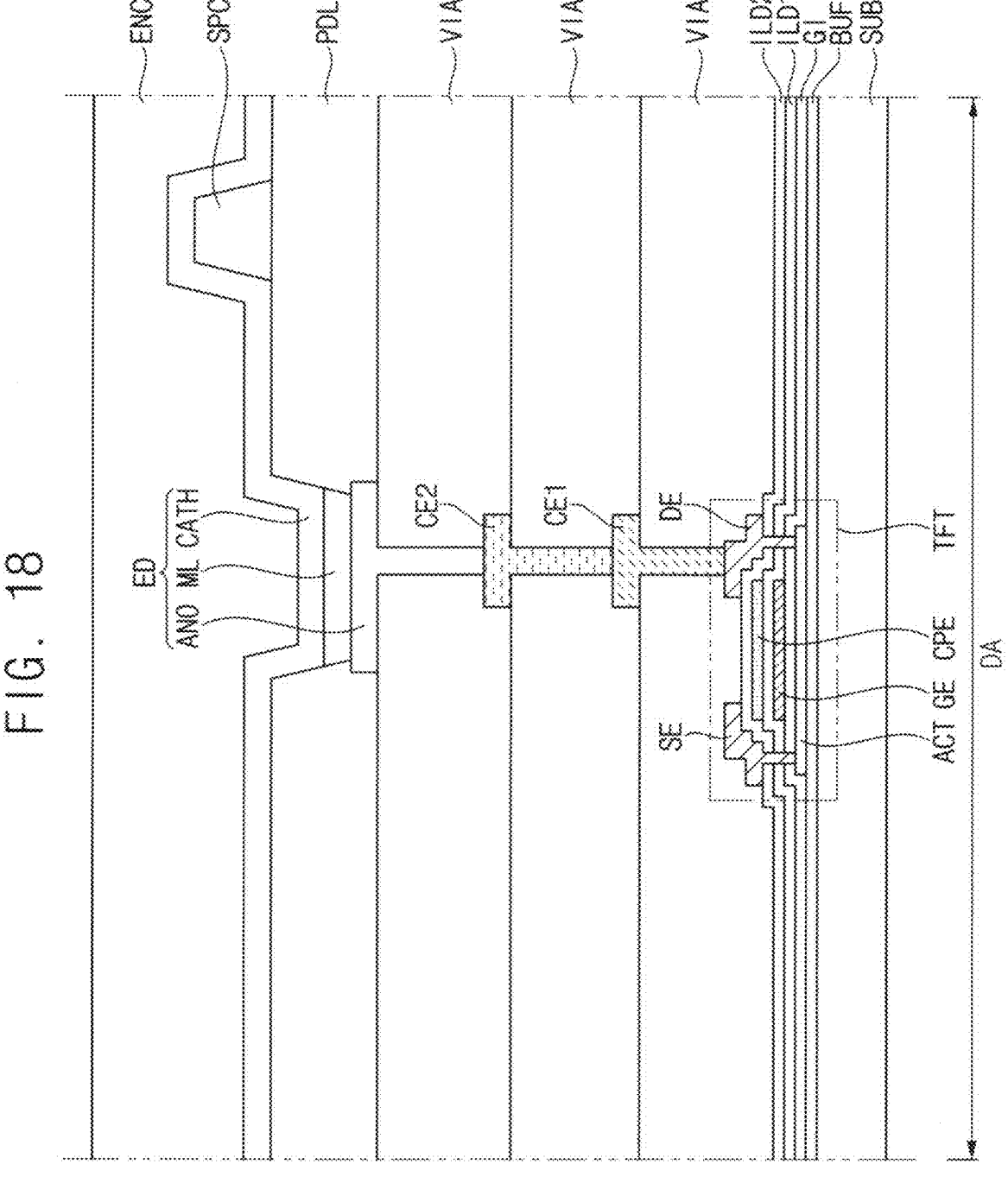
FIG. 18 is a cross-sectional view illustrating a pixel included in the display device of FIG. 1A.

FIG. 18 is a cross-sectional view illustrating a pixel P included in the display device DD of FIG. 1A. FIG. 18 may show a cross-section of a pixel P located in a different area of the display device DD from the pixel P of FIG. 17. FIG. 18 may be substantially the same as FIG. 17, except that the column spacer SPC is added. Accordingly, description overlapping will be omitted.

Referring to FIG. 18, the column spacer SPC may be disposed on the pixel defining layer PDL. The column spacer SPC may be disposed to prevent the gap defect of the display device DD. For example, the column spacer SPC may be disposed to maintain a gap between a component (for example, a touch screen) disposed on the pixel defining layer PDL and the pixel defining layer PDL.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
a display area, a bending area, and a contact area between the display area and the bending area and at which a plurality of lines are connected to each other; and
the plurality of lines including:
    a first gate connection line in the contact area and extended from the contact area toward the display area;
    a first source connection line on the first gate connection line and electrically connected to the first gate connection line, in the contact area;

a second source connection line on the first source connection line and electrically connected to the first source connection line at a contact hole, in the contact area, the second source connection line extending into the bending area from the contact area; and
    a blocking line which is on the second source connection line, overlaps in a plan view with the contact hole at which the second source connection line is electrically connected to the first source connection line and is electrically connected to the second source connection line, in the contact area.

2. The display device of claim 1, wherein the first gate connection line, the first source connection line and the second source connection line overlap each other in the contact area.

3. The display device of claim 1, further comprising:
a first interlayer insulation layer between the first gate connection line and the first source connection line; and
in the contact area:
    a first via insulation layer between the first source connection line and the second source connection line;
    a second via insulation layer between the second source connection line and the blocking line; and
    a third via insulation layer on the second via insulation layer.

4. The display device of claim 3, wherein
the second via insulation layer defines a plurality of grooves exposing the second source connection line to outside the second via insulation layer, and
the blocking line and the third via insulation layer together fill the plurality of grooves which are defined by the second via insulation layer.

5. The display device of claim 3, wherein
the first via insulation layer defines the contact hole in plural including a plurality of grooves exposing the first source connection line to outside the first via insulation layer,
the second source connection line and the second via insulation layer together fill the plurality of grooves, and
the blocking line overlaps in the plan view with all of the plurality of grooves.

6. The display device of claim 3, further comprising:
a pixel defining layer on the third via insulation layer, in the contact area; and
a column spacer on the pixel defining layer, in the contact area.

7. The display device of claim 6, wherein the first via insulation layer, the second via insulation layer, the third via insulation layer, the pixel defining layer and the column spacer extend from the contact area and to the bending area.

8. The display device of claim 1, further comprising:
a second gate connection line between the first gate connection line and the first source connection line, the second gate connection line electrically connecting the first gate connection line and the first source connection line to each other.

9. A display device comprising:
a display area, a bending area, and a contact area between the display area and the bending area and at which a plurality of lines are connected to each other; and
the plurality of lines including:
    a first gate connection line in the contact area and extended from the contact area toward the display area;

a first source connection line on the first gate connection line and electrically connected to the first gate connection line, in the contact area;

a second source connection line on the first source connection line and electrically connected to the first source connection line at a contact hole, in the contact area, the second source connection line extending into the bending area from the contact area; and a blocking line which is on the second source connection line and overlaps in a plan view with the contact hole at which the second source connection line is electrically connected to the first source connection line, in the contact area.

10. The display device of claim 9, wherein the first gate connection line, the first source connection line, the second source connection line and the blocking line overlap each other in the contact area.

11. The display device of claim 9, further comprising:

a first interlayer insulation layer between the first gate connection line and the first source connection line; and in the contact area:

a first via insulation layer between the first source connection line and the second source connection line;

a second via insulation layer between the second source connection line and the blocking line; and a third via insulation layer on the second via insulation layer.

12. The display device of claim 11, wherein the second via insulation layer defines a plurality of grooves exposing the second source connection line to outside the second via insulation layer, and the blocking line and the third via insulation layer together fill the plurality of grooves.

13. The display device of claim 11, wherein the first via insulation layer defines a plurality of grooves exposing the first source connection line to outside the first via insulation layer, and the second source connection line and the second via insulation layer together fill the plurality of grooves.

14. The display device of claim 11, further comprising:

a pixel defining layer on the third via insulation layer, in the contact area; and a column spacer on the pixel defining layer, in the contact area.

15. The display device of claim 14, wherein the first via insulation layer, the second via insulation layer, the third via insulation layer, the pixel defining layer and the column spacer extend from the contact area and to the bending area.

16. The display device of claim 9, further comprising in the contact area:

a voltage line which is on the same layer as the blocking line, is spaced apart from the blocking line and is closer to the display area than the blocking line.

17. The display device of claim 9, wherein the blocking line transmits a constant voltage.

18. The display device of claim 17, wherein the blocking line extends from the contact area and into the display area.

19. The display device of claim 9, further comprising:

a second gate connection line between the first gate connection line and the first source connection line, the second gate connection line electrically connecting the first gate connection line and the first source connection line to each other.

*    *    *    *    *